(12) United States Patent
Saito et al.

(10) Patent No.: US 8,203,139 B2
(45) Date of Patent: Jun. 19, 2012

(54) ORGANIC THIN FILM TRANSISTOR AND ORGANIC THIN FILM LIGHT-EMITTING TRANSISTOR USING AN ORGANIC SEMICONDUCTOR LAYER HAVING AN AROMATIC HYDROCARBON GROUP OR AN AROMATIC HETEROCYCLIC GROUP IN THE CENTER THEREOF

(75) Inventors: Masatoshi Saito, Chiba (JP); Yuki Nakano, Chiba (JP); Hiroaki Nakamura, Chiba (JP)

(73) Assignee: Idemitsu Kosan Co., Ltd, Tokyo (JP)

( * ) Notice: Subject to any disclaimer, the term of this patent is extended or adjusted under 35 U.S.C. 154(b) by 312 days.

(21) Appl. No.: 12/516,085

(22) PCT Filed: Nov. 21, 2007

(86) PCT No.: PCT/JP2007/072578
§ 371 (c)(1),
(2), (4) Date: May 22, 2009

(87) PCT Pub. No.: WO2008/062841
PCT Pub. Date: May 29, 2008

(65) Prior Publication Data
US 2010/0051919 A1 Mar. 4, 2010

(30) Foreign Application Priority Data
Nov. 24, 2006 (JP) .................. 2006-317088

(51) Int. Cl.
*H01L 29/08* (2006.01)
*H01L 35/24* (2006.01)
*H01L 51/00* (2006.01)
(52) U.S. Cl. .................. 257/40; 257/E51.003
(58) Field of Classification Search ............ 257/40, 257/E51.003
See application file for complete search history.

(56) References Cited

U.S. PATENT DOCUMENTS
5,100,985 A * 3/1992 Allen ........................... 526/245
(Continued)

FOREIGN PATENT DOCUMENTS
EP 0 716 458 A2 6/1996
(Continued)

OTHER PUBLICATIONS
Keller, H. and Erb, U.; "Dictionary of Engineering Materials"; John Wiley & Sons, Inc.; p. 268.*
(Continued)

*Primary Examiner* — Stephen W Smoot
*Assistant Examiner* — Vicki B Booker
(74) *Attorney, Agent, or Firm* — Millen, White, Zelano & Branigan, P.C.

(57) ABSTRACT

An organic thin film transistor including a substrate having thereon at least three terminals of a gate electrode, a source electrode and a drain electrode, an insulator layer and an organic semiconductor layer, with a current between a source and a drain being controlled upon application of a voltage to the gate electrode, wherein the organic semiconductor layer includes a specified organic compound having an aromatic hydrocarbon group or an aromatic heterocyclic group in the center thereof; and an organic thin film light emitting transistor utilizing an organic thin film transistor, wherein the organic thin film transistor is one in which light emission is obtained utilizing a current flowing between the source and the drain, and the light emission is controlled upon application of a voltage to the gate electrode, and is made high with respect to the response speed and has a large ON/OFF ratio, are provided.

15 Claims, 3 Drawing Sheets

DEVICE A

U.S. PATENT DOCUMENTS 6,326,640 B1 * 12/2001 Shi et al. .................... 257/40

FOREIGN PATENT DOCUMENTS

| EP | 0 716 459 A2 | 6/1996 |
| --- | --- | --- |
| EP | 0 786 820 A2 | 7/1997 |
| EP | 0 852 403 A1 | 7/1998 |
| EP | 0 921 579 A2 | 6/1999 |
| JP | 05-055568 A | 3/1993 |
| JP | 08-228034 A | 9/1996 |
| JP | 08-228035 A | 9/1996 |
| JP | 09-232589 A | 9/1997 |
| JP | 10-125924 A | 5/1998 |
| JP | 10-135481 A | 5/1998 |
| JP | 10-190001 A | 7/1998 |
| JP | 11-251601 A | 9/1999 |
| JP | 2000-174277 A | 6/2000 |
| JP | 2001-094107 A | 4/2001 |
| JP | 2001-176666 A | 6/2001 |
| JP | 2005-142233 A | 6/2005 |
| JP | 2007-258253 A | 10/2007 |

OTHER PUBLICATIONS

Winter, A.; "Organic Chemistry 1 for Dummies"; 2005; Wiley Publishing, Inc.; Chapter 13; pp. 215-245.*
International Search Report of PCT/JP2007/072578 (Feb. 8, 2008).
Assadi, A. et al., "Field-effect mobility of poly(3-hexylthiophene)," Appl. Phys. Lett., Jul. 18, 1988, vol. 53, No. 3, pp. 195-197.
Brown, A. R. et al., "A universal relation between conductivity and field-effect mobility in doped amorphous organic semiconductors," Synthetic Materials, 1994, pp. 65-70.
Chua, L. et al., "General observation of n-type field-effect behavior in organic semiconductors," Nature, Mar. 10, 2005, vol. 434, pp. 194-199.
Dodabalapur, A. et al., "Organic transistors: Two-dimensional transport and improved electrical characteristics," Science, vol. 268, Apr. 14, 1995.
Ebisawa, F. et al., "Electrical properties of polyacetylene/polysiloxane interface," J. Appl. Phys., Jun. 1983, vol. 54, No. 5, pp. 3255-3259.
Fuchigami, H. et al., "Polythienylenevinylene thin-film transistor with high carrier mobility," Appl. Phys. Lett., Sep. 6, 1993, vol. 63, No. 10, pp. 1372-1374.
Geens, W. et al., "Field-effect mobilities in spin-case and vacuum-deposited PPV-type pentamers," Synthetic Metals, 2001, vol. 122, pp. 191-194.
Guillaud, G. et al., "Field-effect transistors based on intrinsic molecular semiconductors," Chemical Physics Letters, Apr. 13, 1990, vol. 167, No. 6, pp. 503-506.
Horowitz, G. et al., "Thin-film transistors based on alpha-conjugated oligomers," Synthetic Metals, 1991, vol. 41-43, pp. 1127-1130.
Koezuka, H. et al., "Polythiophene field-effect transistor with polypyrrole worked as source and drain electrodes," Appl. Phys. Lett., Apr. 12, 1993, vol. 62, No. 15, pp. 1794-1796.
Kudo, K. et al., "Organic static induction transistor for color sensors," Synthetic Metals, 1999, vol. 102, pp. 900-903.
Kudo, K. et al., "Schottyky gate static induction transistor using copper phthalocyanine films," Thin Solid Films, 1998, vol. 331, pp. 51-54.
Meng, H. et al., "2,6-Bis[2-(4-pentylphenyl)vinyl]anthracene: A single and high charge mobility organic semiconductor with densely packed crystal structure," Journal of American chemical Society, 2006, vol. 128, pp. 9304-9305.
Miyauch, S. et al., "Junction field-effect transistor using polythiophene as an active component," Synthetic Metals, 1991, vol. 41-43, pp. 1155-1158.
Peng, X. et al., "All-organic thin-film transistors made of alpha-sexithienyl semiconducting and various polymeric insulating layers," Appl. Phys. Lett., Nov. 5, 1990, vol. 57, No. 19, pp. 2013-2015.
Sumimoto, T. et al., "Fabrication and Characterization of Field Effect Transistors of Layered Structure Consisting of TMTSF and TCNQ," Synthetic Metals, 1997, vol. 86, pp. 2259-2260.
Garnier, F. et al., "All-polymer field-effect transistor realized by printing techniques," Science, Sep. 16, 1994, vol. 265, pp. 1684-1685.
Schon et al., "Gate-Induced superconductivity in Oligophenylenevinylene single crystals," Advanced Materials, 2001.
Juarez, B. H. et al., "High-energy photonic bandgap in Sb2S3 Inverse Opals by Sulfidation Processing," Advanced Materials, 2003, vol. 15, 478.
Kudo, K. et al., "Organic static induction transistor for display devices," Synthetic Metals, 2000, vol. 111-112, No. 11-14.

* cited by examiner

DEVICE A

DEVICE B

DEVICE C

DEVICE D

ORGANIC THIN FILM TRANSISTOR AND ORGANIC THIN FILM LIGHT-EMITTING TRANSISTOR USING AN ORGANIC SEMICONDUCTOR LAYER HAVING AN AROMATIC HYDROCARBON GROUP OR AN AROMATIC HETEROCYCLIC GROUP IN THE CENTER THEREOF

TECHNICAL FIELD

The present invention relates to an organic thin film transistor having an organic semiconductor layer and to an organic thin film light emitting transistor and in particular, to an organic thin film transistor containing a compound with high mobility and capable of undergoing a high-speed operation and an organic thin film light emitting transistor using the same as a light emitting device.

BACKGROUND ART

A thin film transistor (TFT) is broadly used as a switching element for display of a liquid crystal display, etc. A cross-sectional structure of a representative TFT is shown in FIG. 2. As shown in FIG. 2, TFT has a gate electrode and an insulator electrode in this order on a substrate and has a source electrode and a drain electrode formed at a prescribed interval on the insulator layer. Over the insulator layer exposing between the electrodes, a semiconductor layer is formed while including a partial surface of each of the both electrodes. In TFT of such a configuration, the semiconductor layer forms a channel region and when a current flowing between the source electrode and the drain electrode is controlled by a voltage to be applied to the gate electrode, undergoes an ON/OFF operation.

Hitherto, this TFT has been prepared using amorphous or polycrystalline silicon. However, there was a problem that a CVD apparatus which is used for the preparation of TFT using such silicon is very expensive so that increasing in size of a display, etc. using TFT is accompanied by a significant increase of manufacturing costs. Also, since a process for fabricating amorphous or polycrystalline silicon is carried out at a very high temperature, the kind of a material which can be used as a substrate is limited, causing a problem that a lightweight resin substrate or the like cannot be used.

In order to solve such a problem, TFT using an organic material in place of amorphous or polycrystalline silicon is proposed. With respect to the fabrication method to be employed for forming TFT using an organic material, there are known a vacuum vapor deposition method, a coating method and so on. According to such a fabrication method, it is possible to realize increasing in size of a device while suppressing an increase of the manufacturing costs, and the process temperature which is necessary at the time of fabrication can be made relatively low. For that reason, in TFT using an organic material, there is an advantage that limitations at the time of selection of a material to be used for the substrate are few, and its realization is expected. TFT using an organic material has been eagerly reported, and, for example, Non-Patent Documents 1 to 20 can be enumerated.

Also, as the organic material to be used in an organic compound layer of TFT, so far as a p-type is concerned, multimers such as conjugated polymers, thiophenes, etc. (Patent Documents 1 to 5, etc.); metallophthalocyanine compounds (Patent Document 6, etc.); condensed aromatic hydrocarbons such as pentacene, etc. (Patent Documents 7 and 8, etc.); and the like are used singly or in a state of a mixture with other compounds. Also, so far as a material of an n-type FET is concerned, for example, Patent Document 9 discloses 1,4,5,8-naphthalenetetracarboxyl dianhydride (NTCDA), 11,11,12,12-tetracyanonaphth-2,6-quinodimethane (TCNNQD), 1,4,5,8-naphthalenetetracarboxyl diimide (NTCDI), etc; and Patent Document 10 discloses phthalocyanine fluoride.

Non-Patent Document 19 describes an electron mobility of a phenylene vinylene polymer (polyparaphenylene vinylene (PPV)), which electron mobility is, however, low as $10^{-4}$ $cm^2/Vs$ and does not reach a practical performance. That is, in PPV which is a high-molecular compound, the field effect mobility becomes small due to a disturbance of the crystal structure because of bending to be caused due to a long principal chain structure or the presence of molecular weight distribution.

On the other hand, there is an organic electroluminescence (EL) device as a device similarly using electric conduction. However, the organic EL device generally forcedly feeds charges upon application of a strong electric field of $10^5$ V/cm or more in the thickness direction of a ultra-thin film of not more than 100 nm; whereas in the case of the organic TFT, it is necessary to feed charges at a high speed over a distance of several μm or more in an electric field of not more than $10^5$ V/cm, and accordingly, the organic material itself is required to become more conductive. However, the foregoing compounds in the conventional organic TFTs involved a problem in high-speed response as a transistor because the field effect mobility is low, and the response speed is slow. Also, the ON/OFF ratio was small. The terms "ON/OFF ratio" as referred to herein refer to a value obtained by dividing a current flowing between a source and a drain when a gate voltage is applied (ON) by a current flowing between the source and the drain when no gate voltage is applied (OFF). The terms "ON current" as referred to herein usually refer to a current value (saturated current) at the time when the current flowing between the source and the drain is saturated when the gate voltage is increased.

[Patent Document 1] JP-A-8-228034
[Patent Document 2] JP-A-8-228035
[Patent Document 3] JP-A-9-232589
[Patent Document 4] JP-A-10-125924
[Patent Document 5] JP-A-10-190001
[Patent Document 6] JP-A-2000-174277
[Patent Document 7] JP-A-5-55568
[Patent Document 8] JP-A-2001-94107
[Patent Document 9] JP-A-10-135481
[Patent Document 10] JP-A-11-251601
[Patent Document 11] JP-A-2005-142233
[Non-Patent Document 1] F. Ebisawa, et al., *Journal of Applied Physics*, Vol. 54, page 3255, 1983
[Non-Patent Document 2] A. Assadi, et al., *Applied Physics Letter*, Vol. 53, page 195, 1988
[Non-Patent Document 3] G. Guillaud, et al., *Chemical Physics Letter*, Vol. 167, page 503, 1990
[Non-Patent Document 4] X. Peng, et al., *Applied Physics Letter*, Vol. 57, page 2013, 1990
[Non-Patent Document 5] G. Horowitz, et al., *Synthetic Metals*, Vol. 41-43, page 1127, 1991
[Non-Patent Document 6] S. Miyauchi, et al., *Synthetic Metals*, Vol. 41-43, 1991
[Non-Patent Document 7] H. Fuchigami, et al., *Applied Physics Letter*, Vol. 63, page 1372, 1993
[Non-Patent Document 8] H. Koezuka, et al., *Applied Physics Letter*, Vol. 62, page 1794, 1993
[Non-Patent Document 9] F. Garnier, et al., *Science*, Vol. 265, page 1684, 1994

[Non-Patent Document 10] A. R. Brown, et al., *Synthetic Metals*, Vol. 68, page 65, 1994
[Non-Patent Document 11] A. Dodabalapur, et al., *Science*, Vol. 268, page 270, 1995
[Non-Patent Document 12] T. Sumimoto, et al., *Synthetic Metals*, Vol. 86, page 2259, 1997
[Non-Patent Document 13] K. Kudo, et al., *Thin Solid Films*, Vol. 331, page 51, 1998
[Non-Patent Document 14] K. Kudo, et al., *Synthetic Metals*, Vol. 102, page 900, 1999
[Non-Patent Document 15] K. Kudo, et al., *Synthetic Metals*, Vol. 111-112, page 11, 2000
[Non-Patent Document 16] *Advanced Materials*, Vol. 13, No. 16, 2001, page 1273
[Non-Patent Document 17] *Advanced Materials*, Vol. 15, No. 6, 2003, page 478
[Non-Patent Document 18] W. Geens, et al., *Synthetic Metals*, Vol. 122, page 191, 2001
[Non-Patent Document 19] Lay-Lay Chua, et al., *Nature*, Vol. 434, March 10 issue, 2005, page 194
[Non-Patent Document 20] Hong Meng, et al., *Journal of American Chemical Society*, Vol. 128, page 9304, 2006

DISCLOSURE OF THE INVENTION

Problems that the Invention is to Solve

In order to solve the foregoing problems, the present invention has been made. An object of the present invention is to provide an organic thin film transistor having a high response speed (driving speed) and a large ON/OFF ratio and an organic thin film light emitting transistor using the same.

Means for Solving the Problems

In order to achieve the foregoing object, the present inventors made extensive and intensive investigations. As a result, it has been found that by using an organic compound having a structure represented by the following general formula (a) in an organic semiconductor layer of an organic thin film transistor, the response speed (driving speed) can be made fast, leading to accomplishment of the present invention.

That is, the present invention is to provide an organic thin film transistor comprising a substrate having thereon at least three terminals of a gate electrode, a source electrode and a drain electrode, an insulator layer and an organic semiconductor layer, with a current between a source and a drain being controlled upon application of a voltage to the gate electrode, wherein the organic semiconductor layer includes an organic compound having a structure of the following general formula (a).

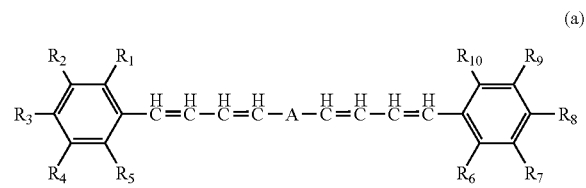

(a)

[In the formula, A represents a divalent aromatic hydrocarbon group having from 6 to 60 carbon atoms or a divalent aromatic heterocyclic group having from 1 to 60 carbon atoms; and $R_1$ to $R_{10}$ each independently represents a hydrogen atom, a halogen atom, a cyano group, an alkyl group having from 1 to 30 carbon atoms, a haloalkyl group having from 1 to 30 carbon atoms, an alkoxyl group having from 1 to 30 carbon atoms, a haloalkoxyl group having from 1 to 30 carbon atoms, an alkylthio group having from 1 to 30 carbon atoms, a haloalkylthio group having from 1 to 30 carbon atoms, an alkylamino group having from 1 to 30 carbon atoms, a dialkylamino group having from 2 to 60 carbon atoms (the alkyl groups may be bonded to each other to form a nitrogen atom-containing cyclic structure), an alkylsulfonyl group having from 1 to 30 carbon atoms, a haloalkylsulfonyl group having from 1 to 30 carbon atoms, an aromatic hydrocarbon group having from 6 to 60 carbon atoms or an aromatic heterocyclic group having from 1 to 60 carbon atoms; each of these groups may have a substituent; and these groups may be connected to each other to form an aromatic hydrocarbon group having from 6 to 60 carbon atoms or an aromatic heterocyclic group having from 1 to 60 carbon atoms.]

Also, the present invention is to provide an organic thin film light emitting transistor in which in an organic thin film transistor, light emission is obtained utilizing a current flowing between a source and a drain, and the light emission is controlled upon application of a voltage to a gate electrode.

Asvantages of the Invention

The organic thin film transistor of the present invention is made high with respect to the response speed (driving speed), has a large ON/OFF ratio and has a high performance as a transistor and therefore, can also be utilized as an organic thin film light emitting transistor which can achieve light emission.

BEST MODES FOR CARRYING OUT THE INVENTION

Figure 1:
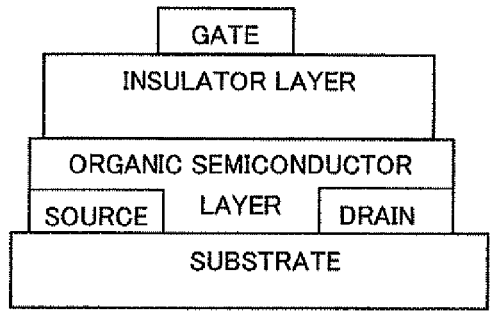
FIG. 1 is a view showing one embodiment of a device configuration of an organic thin film transistor of the present invention.

The present invention is concerned with an organic thin film transistor comprising a substrate having thereon at least three terminals of a gate electrode, a source electrode and a drain electrode, an insulator layer and an organic semiconductor layer, with a current between a source and a drain being controlled upon application of a voltage to the gate electrode, wherein the organic semiconductor layer includes an organic compound having a structure of the following general formula (a).

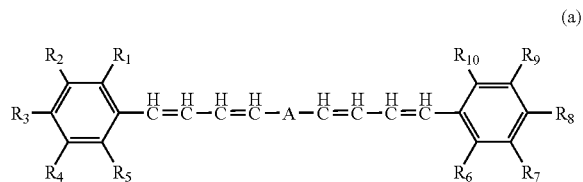

In the foregoing general formula (a), A is a divalent aromatic hydrocarbon group having from 6 to 60 carbon atoms or a divalent aromatic heterocyclic group having from 1 to 60 carbon atoms; preferably a group containing a benzene ring; and also preferably an aromatic heterocyclic group containing a nitrogen atom.

Specific examples of the aromatic hydrocarbon group represented by A include benzene, naphthalene, anthracene, tetracene, pentacene, phenanthrene, chrysene, triphenylene, corannulene, coronene, hexabenzotriphenylene, hexabenzocoronene, sumanene, etc., chrysene is preferable. Also, examples of the aromatic heterocyclic group include pyridine, pyrazine, quinoline, naphthyridine, quinoxaline, phenazine, diazaanthracene, pyridoquinoline, pyrimidoquinazoline, pyrazinoquinoxaline, phenanthroline, carbazole, 6,12-dihydro-6,12-diazaindenofluorene, dibenzothiophene, dithiaindacene, dithiaindenoindene, thienothiophene, dithienothiophene, dibenzofuran, benzodifuran, dibenzoselenophene, diselenaindacene, diselenaindenoindene, dibenzosilole, etc. The aromatic heterocyclic group is preferably an aromatic heterocyclic group containing a 5-membered ring aromatic heterocyclic ring; more preferably an aromatic heterocyclic group containing a 5-membered ring aromatic heterocyclic ring and a benzene ring; and especially preferably an aromatic heterocyclic group in which the 5-membered ring aromatic heterocyclic ring has one or more oxygen atoms or sulfur atoms and an olefin group is connected to the benzene ring. Also, a structure in which the two butadienylene groups are substituted at a symmetric position relative to A is preferable. It is more preferable that the butadienylene groups are substituted such that the structure constituted of A and the butadienylene groups forms a plane; and it is further preferable that A and the butadienylene groups are substituted such that a π electron system constituted of A and the butadienylene groups is long. It is thought that when such a structure is taken, the planarity of the molecule becomes high, and an interaction between the molecules becomes large, whereby a high performance is obtainable.

Also, in the general formula (a), though the stereostructure of the butadienylene group moiety may be mixed, it is preferable that one having a stereostructure in which the conjugated principal chain is trans-configured is a major component.

In the general formula (a), $R_1$ to $R_{10}$ each independently represents a hydrogen atom, a halogen atom, a cyano group, an alkyl group having from 1 to 30 carbon atoms, a haloalkyl group having from 1 to 30 carbon atoms, an alkoxyl group having from 1 to 30 carbon atoms, a haloalkoxyl group having from 1 to 30 carbon atoms, an alkylthio group having from 1 to 30 carbon atoms, a haloalkylthio group having from 1 to 30 carbon atoms, an alkylamino group having from 1 to 30 carbon atoms, a dialkylamino group having from 2 to 60 carbon atoms (the alkyl groups may be bonded to each other to form a nitrogen atom-containing cyclic structure), an alkylsulfonyl group having from 1 to 30 carbon atoms, a haloalkylsulfonyl group having from 1 to 30 carbon atoms, an aromatic hydrocarbon group having from 6 to 60 carbon atoms or an aromatic heterocyclic group having from 1 to 60 carbon atoms; each of these groups may have a substituent; and these groups may be connected to each other to form an aromatic hydrocarbon group having from 6 to 60 carbon atoms or an aromatic heterocyclic group having from 1 to 60 carbon atoms.

In the general formula (a), $R_1$ to $R_{10}$ are each independently preferably a hydrogen atom or an alkyl group having from 1 to 30 carbon atoms; and also preferably a hydrogen atom, a halogen atom, a cyano group or a haloalkyl group having from 1 to 30 carbon atoms.

In the general formula (a), it is preferable that $R_1$, $R_5$, $R_6$ and $R_{10}$ are each independently a hydrogen atom or a fluorine atom.

According to this, when $R_2$ to $R_4$ and $R_7$ to $R_9$ are each a group selected from the foregoing, and the carbon atom number is regulated to not more than 30, there is nothing of an increase of a ratio of stereoregularity control sites ($R_2$ to $R_4$ and $R_7$ to $R_9$) occupied in the general formula (a); the density of a structure having π electrons contributing to the current control is large; the regularity of a film can be controlled; and high field effect mobility and ON/OFF ratio can be obtained.

Furthermore, in the foregoing general formula (a), it is more preferable that $R_2$ to $R_4$ and $R_7$ to $R_9$ are each a hydrogen atom, a halogen atom, a cyano group, an alkyl group having from 1 to 30 carbon atoms or a haloalkyl group having from 1 to 30 carbon atoms.

Also, the organic compound having a specified structure to be used in the organic thin film transistor of the present invention is basically bipolar exhibiting p-type (hole conduction) and n-type (electron conduction) and can be driven as a p-type device or an n-type device through a combination with source and drain electrodes as described later. However, in the foregoing general formula (a), by properly selecting $R_1$ to $R_{10}$ and the group substituting on the divalent aromatic hydrocarbon group having from 6 to 60 carbon atoms or the divalent aromatic heterocyclic group having from 1 to 60 carbon atoms represented by A depending on the necessity, the performances as the p-type and the n-type can be more strengthened. That is, by employing an electron accepting group for $R_1$ to $R_{10}$ and the group substituting on the divalent aromatic hydrocarbon group having from 6 to 60 carbon atoms or the divalent aromatic heterocyclic group having from 1 to 60 carbon atoms represented by A, the lowest unoccupied molecular orbital (LUMO) level is reduced, thereby enabling it to work as an n-type semiconductor. Preferred examples of the electron accepting group include a hydrogen atom, a halogen atom, a cyano group, a haloalkyl group having from 1 to 30 carbon atoms, a haloalkoxyl group having from 1 to 30 carbon atoms, a haloalkylthio group having from 1 to 30 carbon atoms and a haloalkylsulfonyl group having from 1 to 30 carbon atoms. Also, by employing an electron donating group for $R_1$ to $R_{10}$ and the group substituting on the divalent aromatic hydrocarbon group having from 6 to 60 carbon atoms or the divalent aromatic heterocyclic group having from 1 to 60 carbon atoms represented by A, the highest occupied molecular orbital (HOMO) level is increased, thereby enabling it to work as a p-type semiconductor. Preferred examples of the electron donating group include a hydrogen atom, an alkyl group having from 1 to 30 carbon atoms, an alkoxyl group having from 1 to 30 carbon atoms, an alkylthio group having from 1 to 30 carbon atoms, an alkylamino group having from 1 to 30 carbon atoms and a dialkylamino group having from 2 to 60 carbon atoms (the alkyl groups may be bonded to each other to form a nitrogen atom-containing cyclic structure).

Specific examples of each of the groups represented by $R_1$ to $R_{10}$ in the general formula (a) are hereunder described.

Examples of the halogen atom include fluorine, chlorine, bromine and iodine atoms.

Examples of the alkyl group include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, etc.

Examples of the haloalkyl group include a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichoropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, a fluoromethyl group, a 1-fluoromethyl group, a 2-fluoromethyl group, a 2-fluoroisobutyl group, a 1,2-difluoroethyl group, a difluoromethyl group, a trifluoromethyl group, a pentafluoroethyl group, a perfluoroisopropyl group, a perfluorobutyl group, a perfluorocyclohexyl group, etc.

The alkoxyl group is a group represented by $-OX^1$, and examples of $X^1$ are the same as those described for the foregoing alkyl group; and the haloalkoxyl group is a group represented by $-OX^2$, and examples of $X^2$ are the same as those described for the foregoing haloalkyl group.

The alkylthio group is a group represented by $-SX^1$, and examples of $X^1$ are the same as those described for the foregoing alkyl group; and the haloalkylthio group is a group represented by $-SX^2$, and examples of $X^2$ are the same as those described for the foregoing haloalkyl group.

The alkylamino group is a group represented by $-NHX^1$; the dialkylamino group is a group represented by $-NX^1X^3$; and examples of each of $X^1$ and $X^3$ are the same as those described for the foregoing alkyl group. The alkyl groups of the dialkylamino group may be bonded to each other to form a nitrogen atom-containing cyclic structure; and examples of the cyclic structure include pyrrolidine, piperidine etc.

The alkylsulfonyl group is a group represented by $-SO_2X^1$, and examples of $X^1$ are the same as those described for the foregoing alkyl group; and the haloalkylsulfonyl group is a group represented by $-SO_2X^2$, and examples of $X^2$ are the same as those described for the foregoing haloalkyl group.

Examples of the aromatic hydrocarbon group include a phenyl group, a naphthyl group, an anthryl group, a phenanthryl group, a fluorenyl group, a perylenyl group, a pentacenyl group, etc.

Examples of the aromatic heterocyclic group include a furanyl group, a thiophenyl group, a pyrrolyl group, a pyrazolyl group, an imidazolyl group, a triazolyl group, a tetrazolyl group, an oxazolyl group, an isoxazolyl group, a thiazolyl group, a thiadiazolyl group, a pyridinyl group, a pyrimidinyl group, a benzofuranyl group, a benzothiophenyl group, an indolyl group, a quinolinyl group, a carbazolyl group, a dibenzofuranyl group, a dibenzothiophenyl group, etc.

Examples of a substituent which may be further substituted on each of the groups represented in the foregoing general formula (a) include an aromatic hydrocarbon group, an aromatic heterocyclic group, an alkyl group, an alkoxy group, an aralkyl group, an aryloxy group, an arylthio group, an alkoxycarbonyl group, an amino group, a halogen atom, a cyano group, a nitro group, a hydroxyl group, a carboxyl group, etc.

Specific examples of the organic compound having a specified structure to be used in the organic semiconductor layer of the organic thin film transistor of the present invention will be given below, but it should not be construed that the present invention is limited thereto.

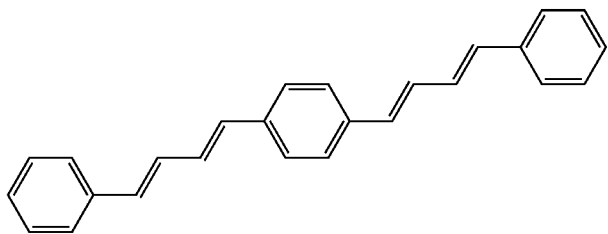

(A-1)

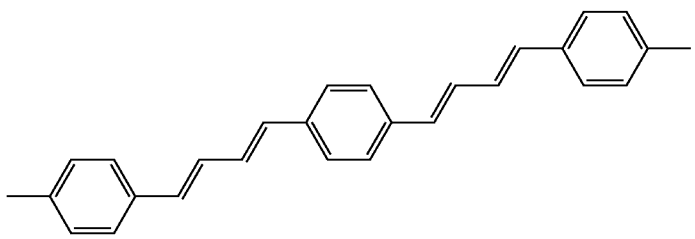

(A-2)

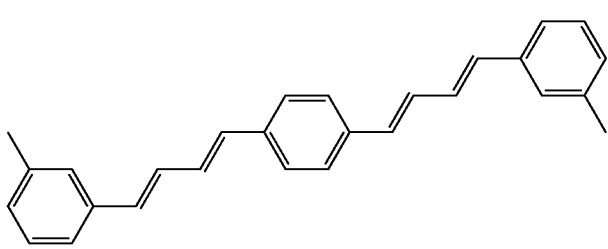

(A-3)

-continued
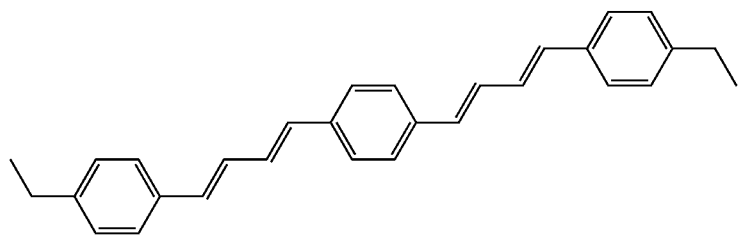
(A-4)
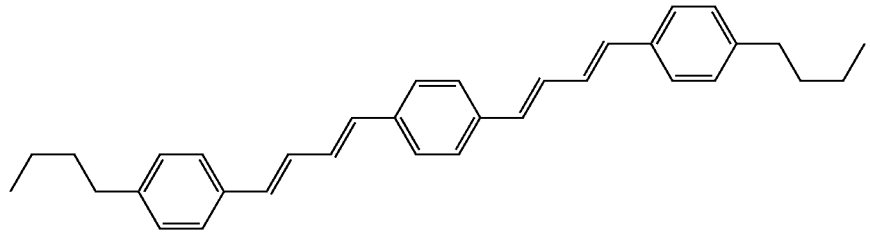
(A-5)
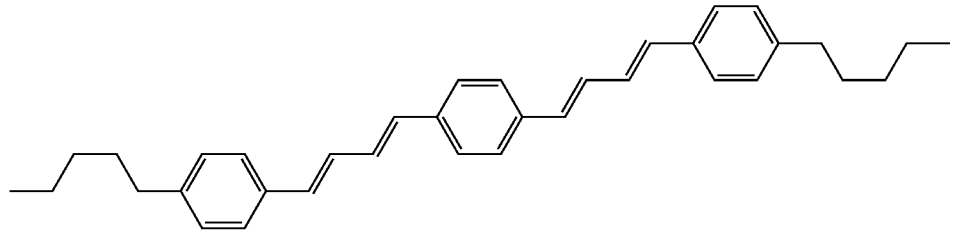
(A-6)
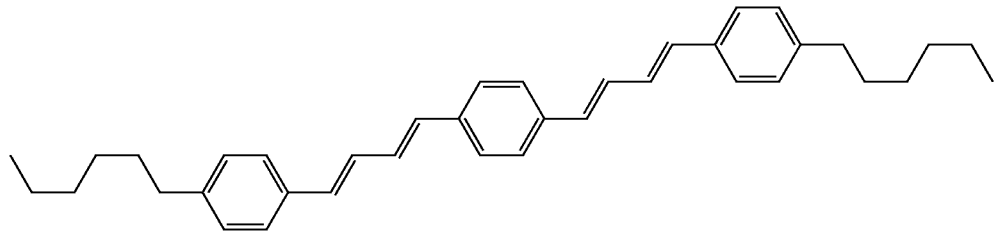
(A-7)
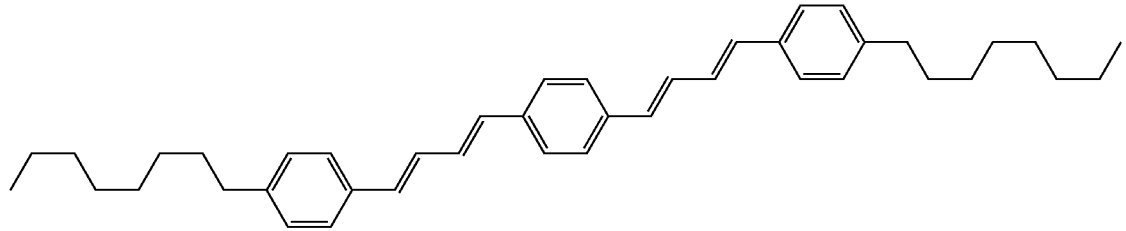
(A-8)
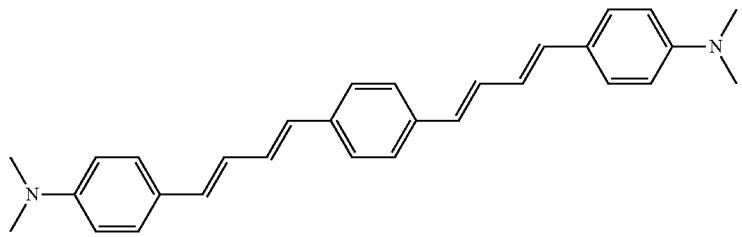
(A-9)

-continued
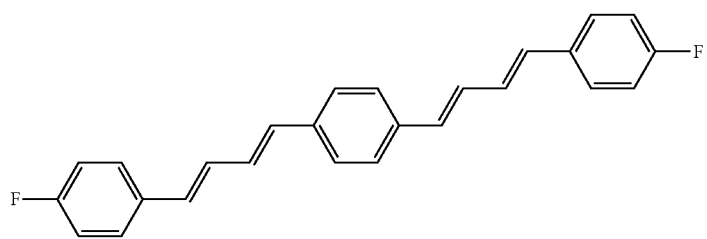 (A-10)
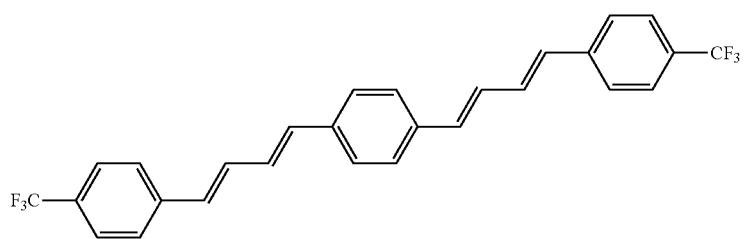 (A-11)
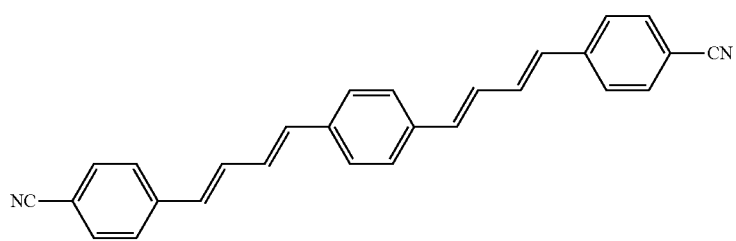 (A-12)
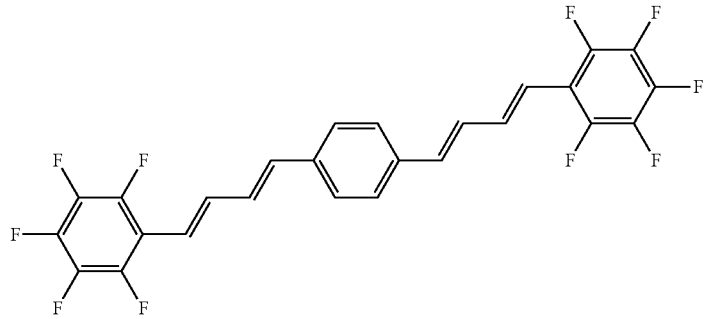 (A-13)
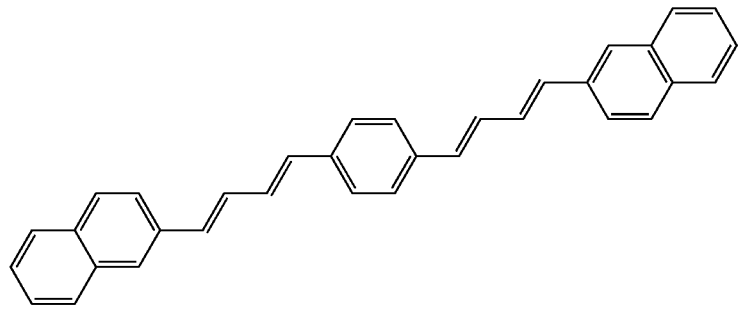 (A-14)
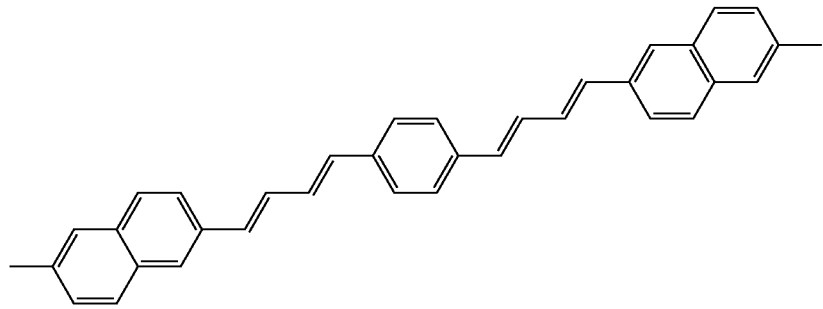 (A-15)

-continued
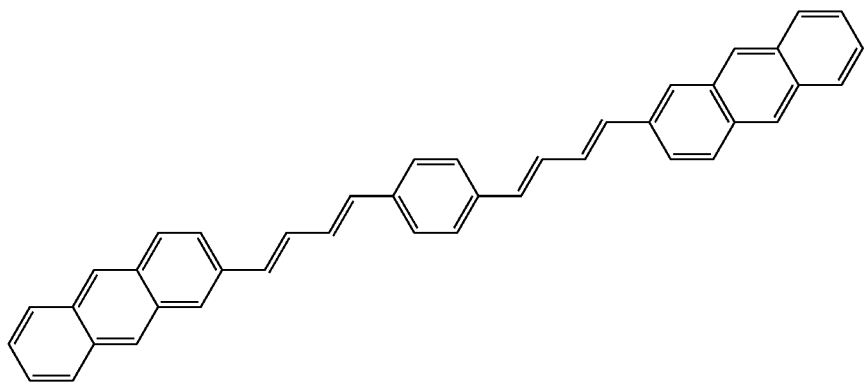
(A-16)
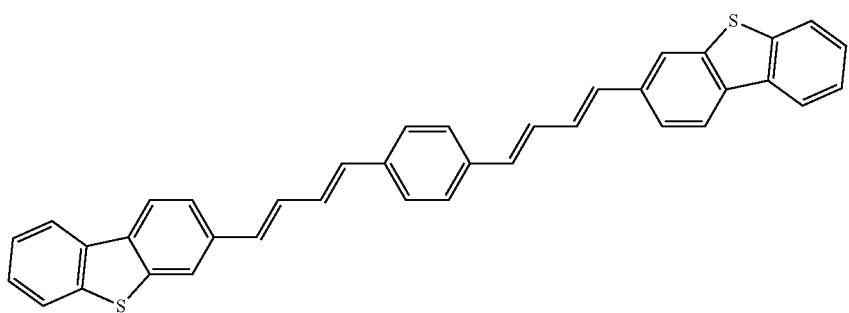
(A-17)
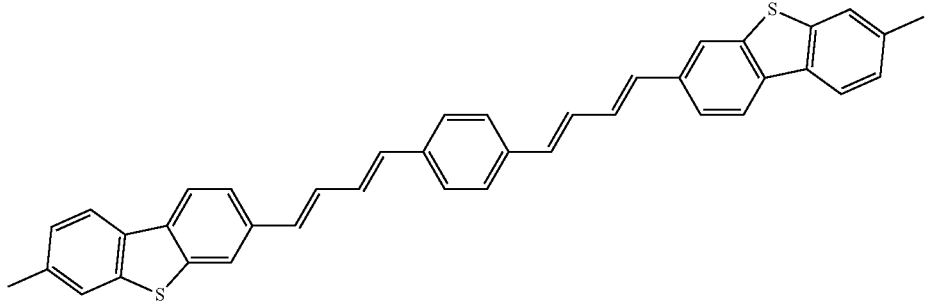
(A-18)
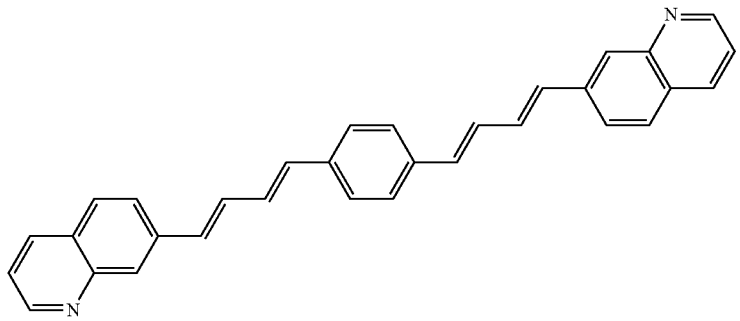
(A-19)
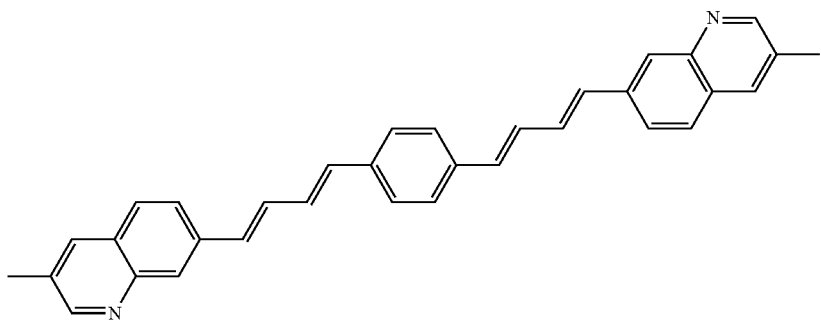
(A-20)

-continued
(A-21)
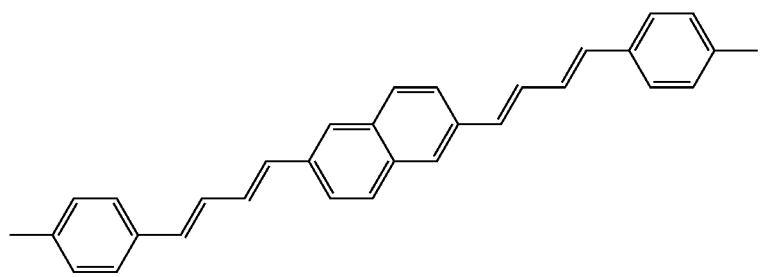
(A-22)
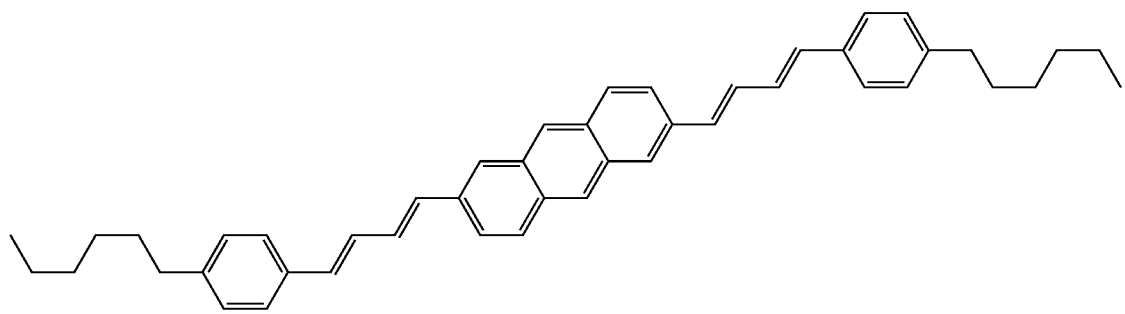
(A-23)
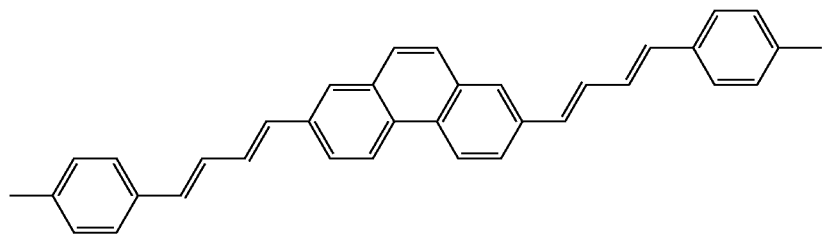
(A-24)
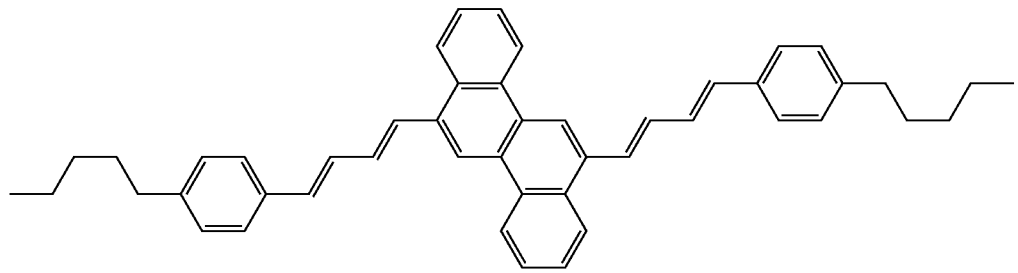
(A-25)
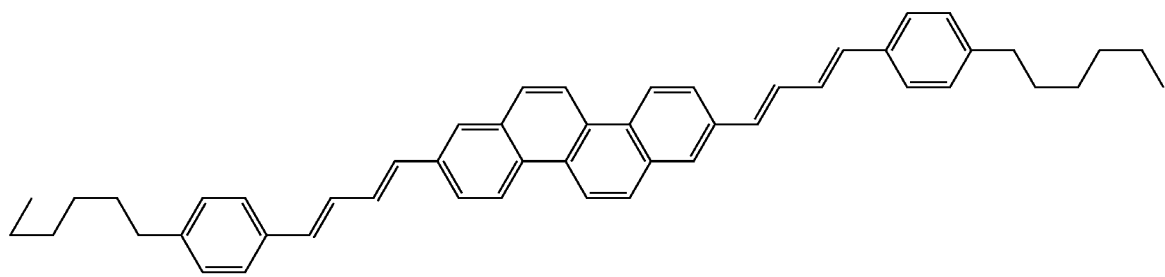

-continued
(A-26)
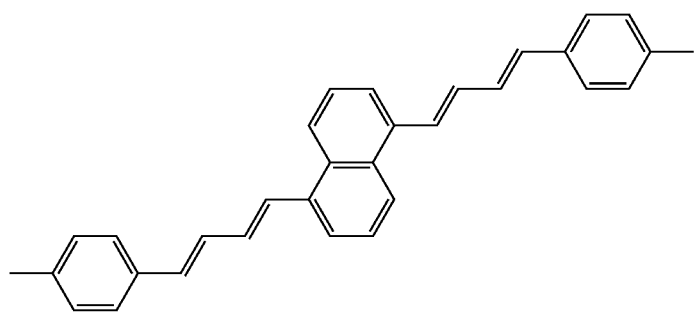
(A-27)
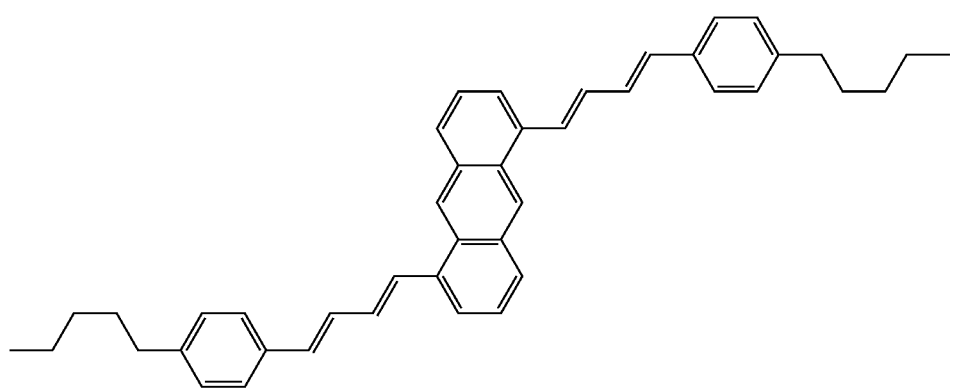
(A-28)
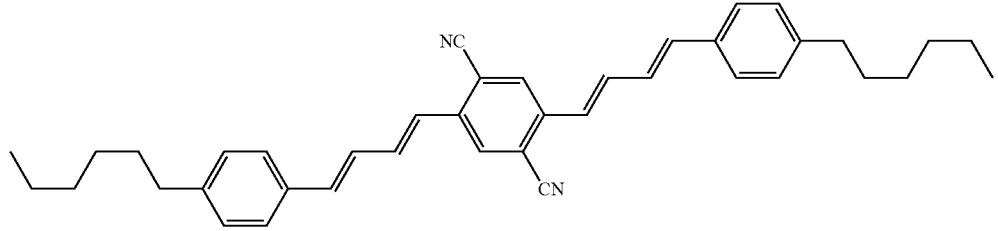
(B-1)
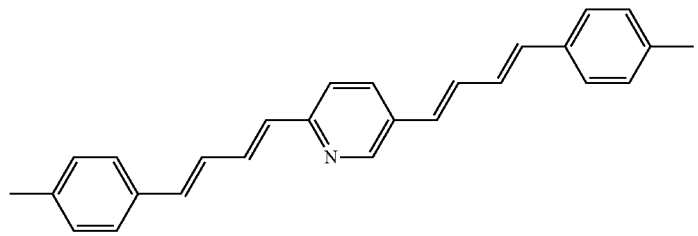
(B-2)
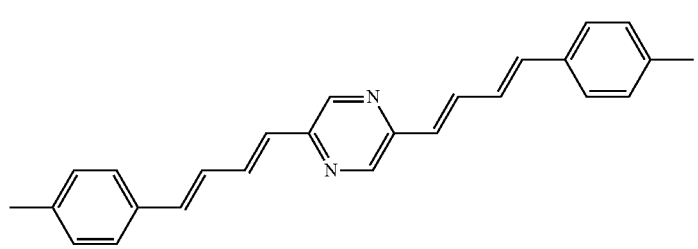

-continued
(B-3)
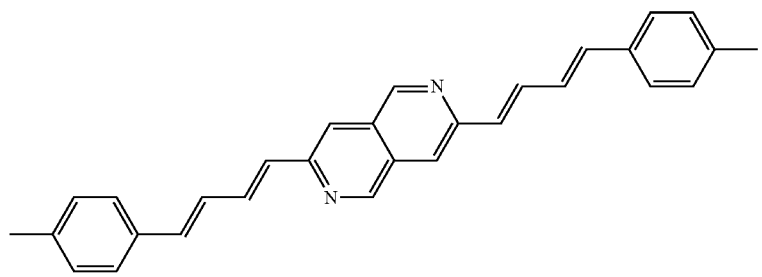
(B-4)
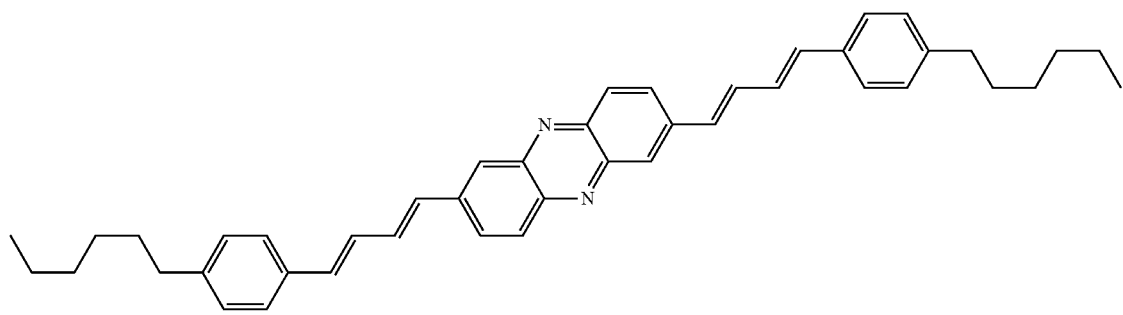
(B-5)
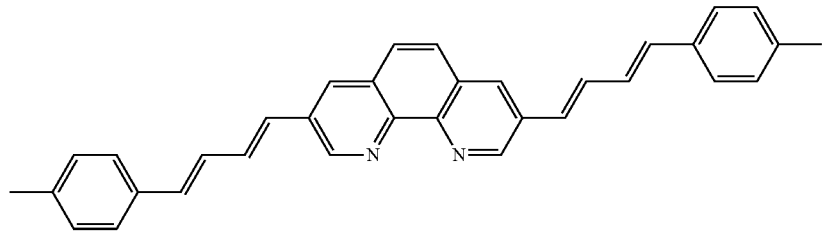
(B-6)
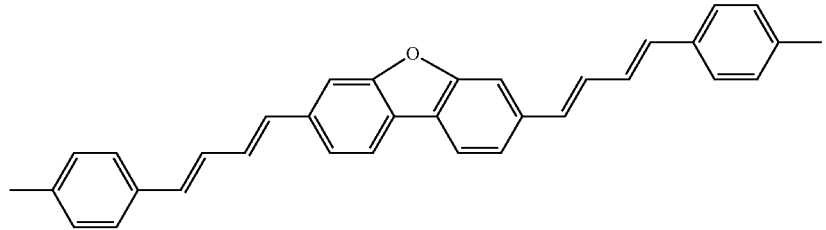
(B-7)
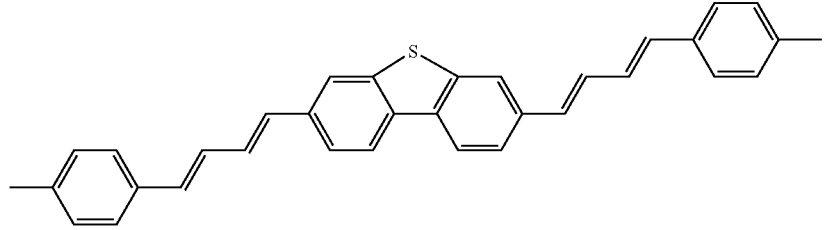
(B-8)
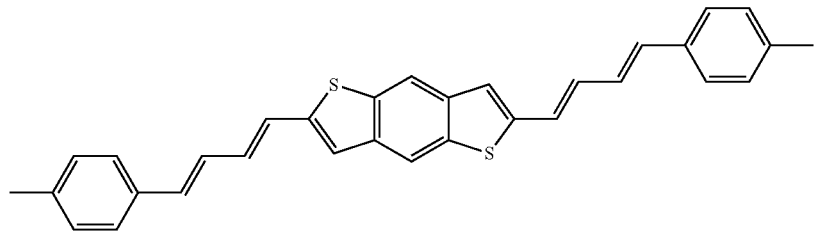

-continued
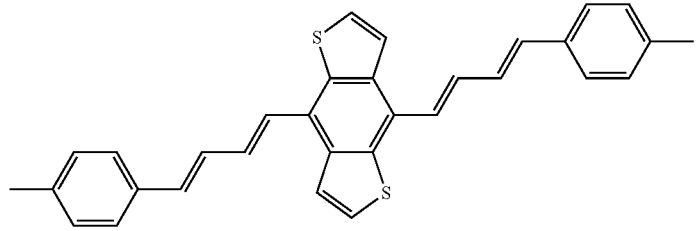
(B-9)
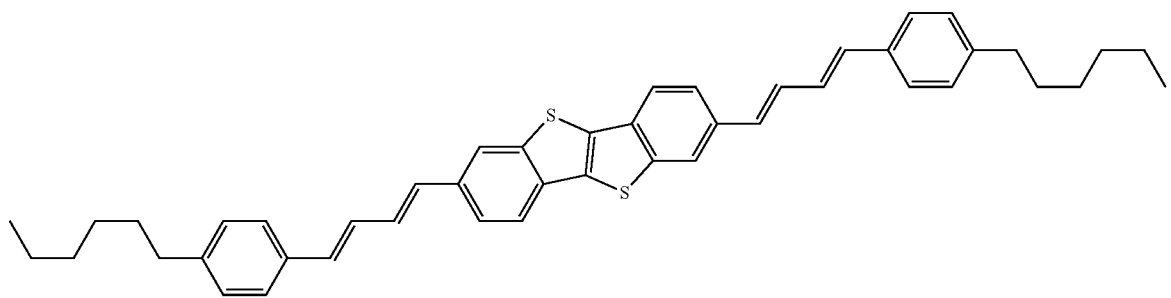
(B-10)
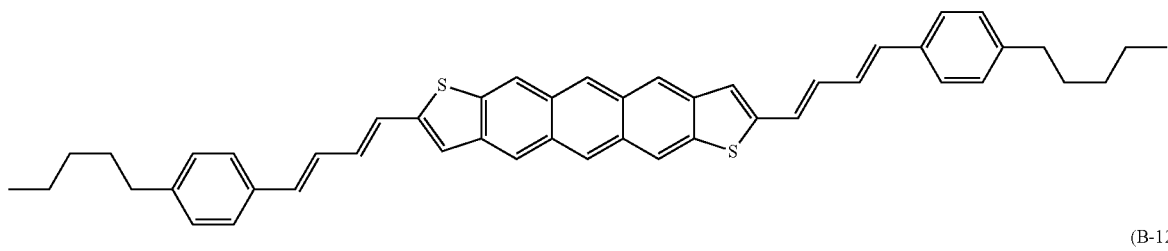
(B-11)
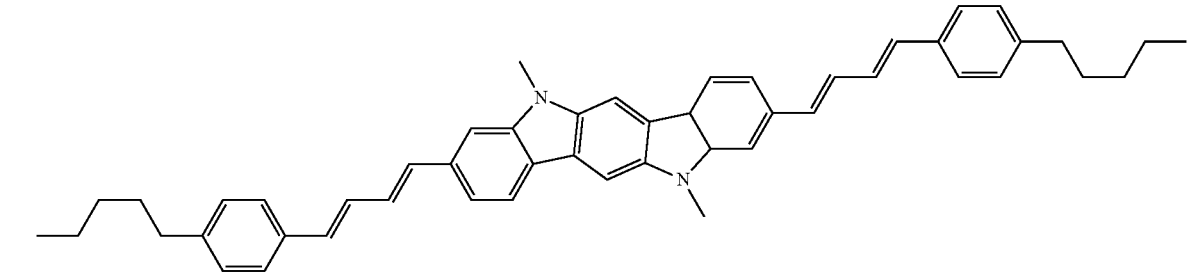
(B-12)
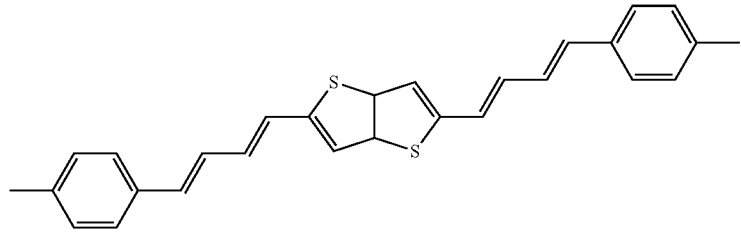
(B-13)
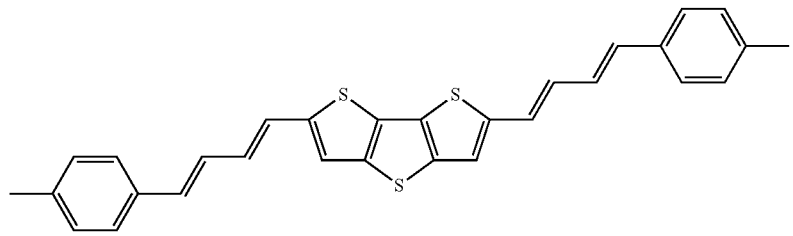
(B-14)
The compound which is used for the organic semiconductor layer of the organic thin film transistor of the present invention can be synthesized by various processes. It can be synthesized by processes described in documents, for example, *Organic Reactions*, Volume 14.3 (John Wiley & Sons, Inc.), *Organic Reactions*, Volume 25.2 (John Wiley & Sons, Inc.), *Organic Reactions*, Volume 27.2 (John Wiley & Sons, Inc.) and *Organic Reactions*, Volume 50.1 (John Wiley & Sons, Inc.). Also, a stereostructure in the olefin moiety can be arranged to a unit position isomer utilizing a thermal reaction, a photoreaction, an addition reaction and so on as the need arises.

In electronic devices such as transistors, a device with high electric field effect mobility and ON/OFF ratio can be obtained by using a high-purity material. Accordingly, it is desirable to apply purification by a measure such as column chromatography, recrystallization, distillation, sublimation, etc. as the need arises. Preferably, it is possible to enhance the purity by repeating such a purification method or combining the plural of these methods. Furthermore, it is desirable to repeat the sublimation purification as a final step of the purification at least two times or more. By using such a measure, it is preferred to use a material having a purify, as measured by HPLC, of 90% or more. There is a possibility that by using a material having a purity of more preferably 95% or more, and especially preferably 99% or more, the electric field effect mobility and the ON/OFF ratio of the organic thin film transistor can be increased, thereby revealing an inherent performance of the material.

The device configuration of the organic thin film transistor of the present invention is hereunder described.

The device configuration of the organic thin film transistor of the present invention is not limited so far as it is concerned with a thin film transistor comprising a substrate having thereon at least three terminals of a gate electrode, a source electrode and a drain electrode, an insulator layer and an organic semiconductor layer, with a current between a source and a drain being controlled upon application of a voltage to the gate electrode. Those having a known device configuration may be employed.

Of these, representative device configurations of the organic thin film transistor are shown as devices A to D in FIGS. 1 to 4. As described above, there are known some configurations regarding the locations of electrodes, the lamination order of layers and so on. The organic thin film transistor of the present invention has a field effect transistor (FET) structure. The organic thin film transistor has an organic semiconductor layer (organic compound layer), a source electrode and a drain electrode formed opposing each other at a prescribed interval and a gate electrode formed at a prescribed distance from each of the source electrode and the drain electrode, and a current flowing between the source and drain electrodes is controlled upon application of a voltage to the gate electrode. Here, the interval between the source electrode and the drain electrode is determined by the use purpose of the organic thin film transistor of the present invention and is usually from 0.1 μm to 1 mm, preferably from 1 μm to 100 μm, and more preferably from 5 μm to 100 μm.

Figure 2:
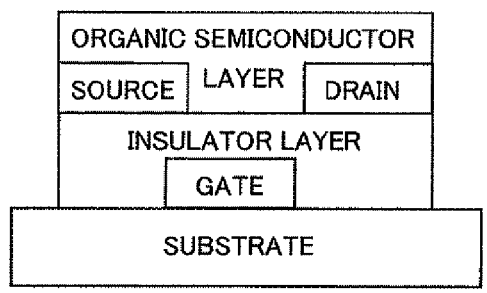
FIG. 2 is a view showing one embodiment of a device configuration of an organic thin film transistor of the present invention.
Figure 3:
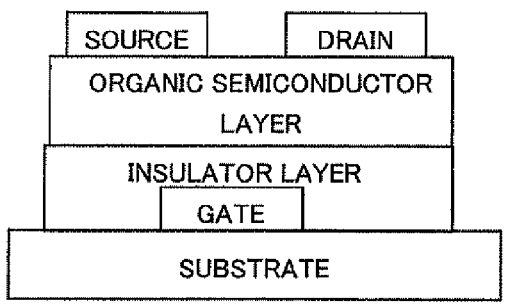
FIG. 3 is a view showing one embodiment of a device configuration of an organic thin film transistor of the present invention.

Among the devices A to D, the device B of FIG. 2 is described as an embodiment in more detail. The organic thin film transistor of the device B has a gate electrode and an insulator layer in this order on a substrate and has a pair of a source electrode and a drain electrode formed at a prescribed interval on the insulator layer, and an organic semiconductor layer is formed thereon. The organic semiconductor layer forms a channel region, and a current flowing between the source electrode and the drain electrode is controlled by a voltage to be applied to the gate electrode, thereby undergoing an ON/OFF operation.

Figure 5:
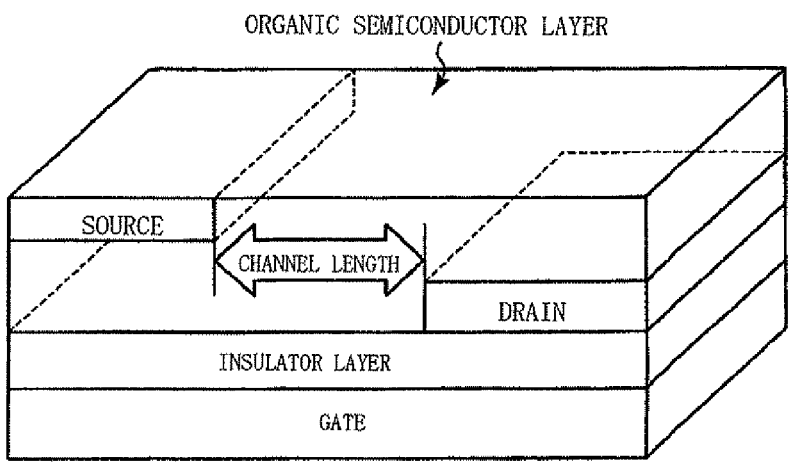
FIG. 5 is a view showing one embodiment of a device configuration of an organic thin film transistor of the present invention.
Figure 6:
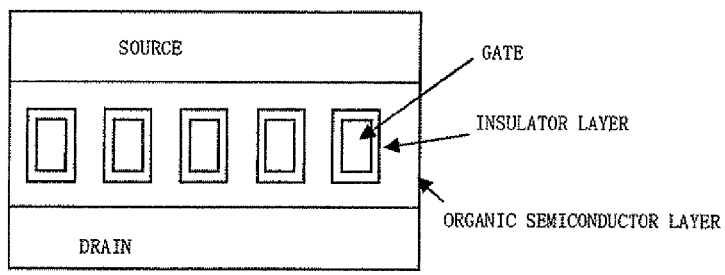
FIG. 6 is a view showing one embodiment of a device configuration of an organic thin film transistor of the present invention.

With respect to the organic thin film transistor of the present invention, various configurations are proposed as the organic thin film transistor for the device configuration other than the foregoing devices A to D. The device configuration is not limited to these device configurations so far as it has a mechanism revealing an effect for undergoing an ON/OFF operation or amplification with a current flowing between the source electrode and the drain electrode being controlled by a voltage to be applied to the gate electrode. Examples of the device configuration include a top and bottom contact type organic thin film transistor (see FIG. 5) proposed in the proceedings for the 49th Spring Meeting, The Japan Society of Applied Physics, 27a-M-3 (March 2002) by Yoshida, et al. in National Institute of Advanced Industrial Science and Technology and a vertical type organic thin film transistor (see FIG. 6) proposed on page 1440 in *IEEJ Transactions,* 118-A (1998) by Kudo, et al. of Chiba University.

(Substrate)

Figure 8:
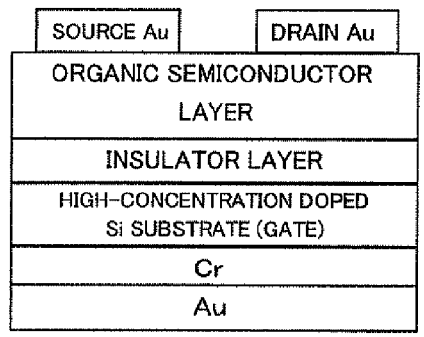
FIG. 8 is a view showing one embodiment of a device configuration of an organic thin film transistor in the Examples of the present invention.

The substrate in the organic thin film transistor of the present invention bears a role of supporting the structure of the organic thin film transistor. Besides glasses, inorganic compounds such as metal oxides or nitrides, etc., plastic films (for example, PET, PES or PC), metal substrates, composites or laminates thereof and so on can also be used as a material of the substrate. Also, in the case where the structure of the organic fin film transistor can be sufficiently supported by a constituent other than the substrate, there is a possibility that the substrate is not used. Also, a silicon (Si) wafer is frequently used as a material of the substrate. In that case, Si itself can be used as the substrate also serving as the gate electrode. Also, it is possible to oxidize the surface of Si to form $SiO_2$, thereby utilizing it as an insulating layer. In that case, as shown in FIG. 8, there may be the case where a metal layer such as Au, etc. is fabricated as an electrode for connecting a lead wire on the Si substrate of the gate electrode also serving as the substrate.

(Electrode)

Materials of the gate electrode, the source electrode and the drain electrode in the organic thin film transistor of the present invention are not particularly limited so far as they are a conductive material. Examples thereof include platinum, gold, silver, nickel, chromium, copper, iron, tin, antimony-lead, tantalum, indium, palladium, tellurium, rhenium, iridium, aluminum, ruthenium, germanium, molybdenum, tungsten, antimony tin oxide, indium tin oxide (ITO), fluorine-doped zinc oxide, zinc, carbon, graphite, glassy carbon, a silver paste and a carbon paste, lithium, beryllium, sodium, magnesium, potassium, calcium, scandium, titanium, manganese, zirconium, gallium, niobium, sodium, a sodium-potassium alloy, magnesium, lithium, aluminum, a magnesium/copper mixture, a magnesium/silver mixture, a magnesium/aluminum mixture, a magnesium/indium mixture, an aluminum/aluminum oxide mixture, a lithium/aluminum mixture, etc.

In the organic thin film transistor of the present invention, an electrode formed using a fluidic electrode material containing the foregoing conductive material, such as a solution, a paste, an ink, a dispersion, etc., in particular, a fluidic electrode material containing a conductive polymer or a metal fine particle containing platinum, gold, silver or copper, is preferable as the source electrode and the drain electrode. Also, for the purpose of suppressing damage to the organic semiconductor, it is preferable that the solvent or dispersion medium is a solvent or a dispersion medium each containing 60% by mass or more, and preferably 90% by mass or more of water. As a dispersion containing a metal fine particle, for example, a known conductive paste or the like may be used. In general, it is preferable that the dispersion is a dispersion containing a metal fine particle having a particle size of from 0.5 nm to 50 nm, and preferably from 1 nm to 10 nm. Examples of a material of this metal fine particle which can be used include platinum, gold, silver, nickel, chromium, copper, iron, tin, antimony-lead, tantalum, indium, palladium, tellurium, rhenium, iridium, aluminum, ruthenium, germanium, molybdenum, tungsten, zinc, etc.

It is preferable that an electrode is formed using a dispersion prepared by dispersing such a metal fine particle in water or a dispersion medium as an arbitrary organic solvent using a dispersion stabilizer composed mainly of an organic material. Examples of a method for manufacturing a dispersion of such a metal fine particle include a physical formation method such as a gas evaporation method, a sputtering method, a metal vapor synthesis method, etc.; and a chemical formation method for reducing a metal ion in a liquid phase to form a metal fine particle, such as a colloid method, a coprecipitation method, etc. Dispersions of a metal fine particle manufactured by a colloid method disclosed in JP-A-11-76800, JP-A-11-80647, JP-A-11-319538, JP-A-2000-239853, etc., or a gas evaporation method disclosed in JP-A-2001-254185, JP-A-2001-53028, JP-A-2001-35255, JP-A-2000-124157, JP-A-2000-123634, etc. are preferable.

The electrode is molded using such a metal fine particle dispersion; the solvent is dried; and thereafter, the molded article is heated in a desired shape at a temperature in the range of from 100° C. to 300° C., and preferably from 150° C. to 200° C. as the need arises, thereby thermally fusing the metal fine particle. There is thus formed an electrode pattern having a desired shape.

Furthermore, it is preferable that a known conductive polymer whose conductivity has been enhanced by means of doping or the like is used as each of the materials of the gate electrode, the source electrode and the drain electrode. For example, conductive polyanilines, conductive polypyrroles, conductive polythiolphenes (for example, a complex of polyethylene dioxythiophene and polystyrene sulfonate, etc.), a complex of polyethylene dioxythiophene (PEDOT) and polystyrene sulfonate and so on are also suitably used. These materials are able to reduce the contact resistance of each of the source electrode and the drain electrode with the organic semiconductor layer.

Among the foregoing examples, those materials having small electric resistance on the contact surface with the organic semiconductor layer are preferable with respect to the material for forming each of the source electrode and the drain electrode. On that occasion, when a current control device is prepared, the electric resistance is corresponding to the electric effect mobility, and it is necessary that the resistance is as small as possible for the purpose of obtaining a large mobility. In general, this is determined by a large and small relation between a work function of the electrode material and an energy level of the organic semiconductor layer.

When a work function (W) of the electrode material is defined as "a", an ionized potential (Ip) of the organic semiconductor layer is defined as "b", and an electron affinity (Af) of the organic semiconductor layer is defined as "c", it is preferable that they meet the following relational expression. Here, each of a, b and c is a positive value on the basis of vacuum level.

In the case of a p-type organic thin film transistor, (b−a)<1.5 eV (expression (I)) is preferable; and (b−a)<1.0 eV is more preferable. In the relation with the organic semiconductor layer, when the foregoing relation can be maintained, a device with high performance can be obtained. In particular, it is preferred to choose an electrode material having a large work function as far as possible. The work function is preferably 4.0 eV or more, and the work function is more preferably 4.2 eV or more.

A value of the work function of the metal may be selected from the list of effective metals having a work function of 4.0 eV or more, which is described in, for example, *Kagaku Binran Kiso-hen II* (Handbook of Chemistry, Fundamentals II), page 493 (Third Edition, edited by the Chemical Society of Japan and published by Maruzen Co., Ltd., 1983). A metal having a high work function is mainly Ag (4.26, 4.52, 4.64, 4.74 eV), Al (4.06, 4.24, 4.41 eV), Au (5.1, 5.37, 5.47 eV), Be (4.98 eV), Bi (4.34 eV), Cd (4.08 eV), Co (5.0 eV), Cu (4.65 eV), Fe (4.5, 4.67, 4.81 eV), Ga (4.3 eV), Hg (4.4 eV), Ir (5.42, 5.76 eV), Mn (4.1 eV), Mo (4.53, 4.55, 4.95 eV), Nb (4.02, 4.36, 4.87 eV), Ni (5.04, 5.22, 5.35 eV), Os (5.93 eV), Pb (4.25 eV), Pt (5.64 eV), Pd (5.55 eV), Re (4.72 eV), Ru (4.71 eV), Sb (4.55, 4.7 eV), Sn (4.42 eV), Ta (4.0, 4.15, 4.8 eV), Ti (4.33 eV), V (4.3 eV), W (4.47, 4.63, 5.25 eV) or Zr (4.05 eV). Of these, noble metals (for example, Ag, Au, Cu or Pt), Ni, Co, Os, Fe, Ga, Ir, Mn, Mo, Pd, Re, Ru, V and W are preferable. Besides the metals, ITO, conductive polymers such as polyanilines and PEDOT:PSS, and carbon are preferable. Even when one or plural kinds of such a material having a high work function are included as the electrode material, so far as the work function meets the foregoing expression (I), there are no particular limitations.

In the case of an n-type organic thin film transistor, (a−c)<1.5 ev (expression (II)) is preferable; and (a−c)<1.0 eV is more preferable. In the relation with the organic semiconductor layer, when the foregoing relation can be maintained, a device with high performance can be obtained. In particular, it is preferred to choose an electrode material having a small work function as far as possible. The work function is preferably not more than 4.3 eV or more, and the work function is more preferably not more than 3.7 eV.

A value of the work function of the metal having a low work function may be selected from the list of effective metals having a work function of 4.3 eV or less, which is described in, for example, *Kagaku Binran Kiso-hen II* (Handbook of Chemistry, Fundamentals II), page 493 (Third Edition, edited by the Chemical Society of Japan and published by Maruzen Co., Ltd., 1983). Examples thereof include Ag (4.26 eV), Al (4.06, 4.28 eV), Ba (2.52 eV), Ca (2.9 eV), Ce (2.9 eV), Cs (1.95 eV), Er (2.97 eV), Eu (2.5 eV), Gd (3.1 eV), Hf (3.9 eV), In (4.09 eV), K (2.28 eV), La (3.5 eV), Li (2.93 eV), Mg (3.66 eV), Na (2.36 eV), Nd (3.2 eV), Rb (4.25 eV), Sc (3.5 eV), Sm (2.7 eV), Ta (4.0, 4.15 eV), Y (3.1 eV), Yb (2.6 eV), Zn (3.63 eV), etc. Of these, Ba, Ca, Cs, Er, Eu, Gd, Hf, K, La, Li, Mg, Na, Nd, Rb, Y, Yb and Zn are preferable. Even when one or plural kinds of such a material having a low work function are included as the electrode material, so far as the work function meets the foregoing expression (II), there are no particular limitations. However, it is desirable that the metal having a low work function is covered by a metal which is stable in air, such as Ag and Au, as the need arises because when it comes into contact with moisture or oxygen in the air, it is easily deteriorated. The thickness necessary for covering is required to be 10 nm or more, and as the thickness becomes thick, the metal can be protected from oxygen or water. However, it is desirable that the thickness is not more than 1 μm for the reasons of practical use, an increase of productivity, etc.

With respect to a method for forming the electrode, the electrode is formed by a method, for example, vapor deposition, electron beam vapor deposition, sputtering, an atmospheric pressure plasma method, ion plating, chemical vapor phase vapor deposition, electrodeposition, electroless plating, spin coating, printing, inkjetting, etc. Also, with respect to a patterning method of a conductive thin film formed using the foregoing method, which is carried out as the need arises, there are a method for forming an electrode using a known photo lithographic method or a lift off method; and a method of forming a resist by means of heat transfer, inkjetting, etc. onto a metal foil such as aluminum, copper, etc. and etching it. Also, a conductive polymer solution or dispersion, a metal fine particle-containing dispersion or the like may be subjected to patterning directly by an inkjetting method or maybe formed from a coated film by means of lithography, laser abrasion, etc. Furthermore, a method for patterning a conductive ink, a conductive paste, etc. containing a conductive polymer or a metal fine particle by a printing method such as relief printing, intaglio printing, planographic printing, screen printing, etc. can be employed.

The thickness of the thus formed electrode is not particularly limited so far as the electrode is electrically conductive. It is preferably in the range of from 0.2 nm to 10 μm, and more preferably from 4 nm to 300 nm. When thickness of the electrode falls within this preferred range, the resistance is high because of the fact that the thickness is thin, whereby any voltage drop is not caused. Also, since the thickness is not excessively thick, it does not take a long period of time to form a film, and in the case of laminating other layers such as a protective layer, an organic semiconductor layer, etc., a laminated film can be smoothly formed without causing a difference in level.

Also, in the organic thin film transistor of the present embodiment, for example, for the purpose of enhancing injection efficiency, a buffer layer may be provided between the organic semiconductor layer and each of the source electrode and the drain electrode. With respect to the buffer layer, a compound having an alkali metal or alkaline earth metal ionic bond, which is used for a negative electrode of an organic EL device, such as LiF, $Li_2O$, CsF, $NaCO_3$, KCl, $MgF_2$, $CaCO_3$, etc., is desirable for the n-type organic thin film transistor. Also, a compound which is used as an electron injection layer or an electron transport layer in an organic EL device, such as Alq may be inserted.

Cyano compounds such as $FeCl_3$, TCNQ, $F_4$-TCNQ, HAT, etc.; CFx; oxides of a metal other than alkali metals or alkaline earth metals, such as $GeO_2$, $SiO_2$, $MoO_3$, $V_2O_5$, $VO_2$, $V_2O_3$, MnO, $Mn_3O_4$, $ZrO_2$, $WO_3$, $TiO_2$, $In_2O_3$, ZnO, NiO, $HfO_2$, $Ta_2O_5$, $ReO_3$, $PbO_2$, etc.; and inorganic compounds such as ZnS, ZnSe, etc. are desirable for the p-type organic thin film transistor. In many cases, the most of these oxides cause oxygen deficiency, and this is suitable for hole injection. Furthermore, compounds which are used for a hole injection layer or a hole transport layer in an organic EL device, such as amine based compounds, for example, TPD, NPD, etc., CuPc (copper phthalocyanine), etc., may be used. Also, a combination of two or more kinds of the foregoing compounds is desirable.

It is known that the buffer layer decreases a threshold voltage upon lowering an injection barrier of a carrier, thereby bringing an effect for driving a transistor at a low voltage. We have found that the buffer layer brings not only the low voltage effect but an effect for enhancing the mobility with respect to the compound of the present invention. This is because a carrier trap exists at the interface between the organic semiconductor and the insulator layer; and when carrier injection is caused upon application of a gate voltage, the first injected carrier is used for burying the trap; however, when the buffer layer is inserted, the trap is buried at a low voltage, thereby enhancing the mobility. It would be better that the buffer layer exists thinly between the electrode and the organic semiconductor layer, and its thickness is from 0.1 nm to 30 nm, and preferably from 0.3 nm to 20 nm.

(Insulator Layer)

A material of the insulator layer in the organic thin film transistor of the present invention is not particularly limited so far as it is electrically insulative and can be formed as a thin film. Materials having an electric resistivity of 10 Ωcm or more at room temperature, such as metal oxides (including an oxide of silicon), metal nitrides (including a nitride of silicon), polymers, organic low-molecular weight compounds, etch, can be used; and inorganic oxide films having a high dielectric constant are especially preferable.

Examples of the inorganic oxide include silicon oxide, aluminum oxide, tantalum oxide, titanium oxide, tin oxide, vanadium oxide, barium strontium titanate, zirconic acid barium titanate, zirconic acid lead titanate, lanthanum lead titanate, strontium titanate, barium titanate, magnesium barium fluoride, lanthanum oxide, fluorine oxide, magnesium oxide, bismuth oxide, bismuth titanate, niobium oxide, bismuth strontium titanate, bismuth strontium tantalate, tantalum pentoxide, tantalic acid bismuth niobate, trioxide yttrium and combinations thereof, with silicon oxide, aluminum oxide, tantalum oxide and titanium oxide being preferable.

Also, inorganic nitrides such as silicon nitrides (for example, $Si_3N_4$ or $Si_xN_y$ (x, y>0)), aluminum nitride, etc. can be suitably used.

Furthermore, the insulator layer may be formed of a precursor including a metal alkoxide. For example, the insulator layer is formed by coating a solution of this precursor on, for example, a substrate and subjecting this to a chemical solution treatment including a heat treatment.

The metal of the foregoing metal alkoxide is selected from transition metals, lanthanoids and main group elements. Specific examples thereof include barium (Ba), strontium (Sr), titanium (Ti), bismuth (Bi), tantalum (Ta), zirconium (Zr), iron (Fe), nickel (Ni), manganese (Mn), lead (Pb), lanthanum (La), lithium (Li), sodium (Na), potassium (K), rubidium (Rb), cesium (Cs), francium (Fr), beryllium (Be), magnesium (Mg), calcium (Ca), niobium (Nb), thallium (Tl), mercury (Hg), copper (Cu), cobalt (Co), rhodium (Rh), scandium (Sc), yttrium (Y), etc. Also, examples of the alkoxide in the foregoing metal alkoxide include those derived from alcohols, for example, methanol, ethanol, propanol, isopropanol, butanol, isobutanol, etc.; alkoxy alcohols, for example, methoxyethanol, ethoxyethanol, propoxyethanol, butoxyethanol, pentoxyethanol, heptoxyethanol, methoxypropanol, ethoxypropanol, propoxypropanol, butoxypropanol, pentoxypropanol, heptoxypropanol, etc.; and so on.

In the present invention, when the insulator layer is constituted of the foregoing material, a depletion layer is easily formed in the insulator layer, whereby the threshold voltage of the transistor operation can be reduced. Also, in particular, when the insulator layer is formed of a silicon nitride such as $Si_3N_4$, $Si_xN_y$, $SiON_x$ (x, y>0), etc. among the foregoing materials, a deletion layer more easily generates, whereby the threshold voltage of the transistor operation can be more reduced.

With respect to the insulator layer using an organic compound, polyimides, polyamides, polyesters, polyacrylates, photo radical polymerization based or photo cation polymerization based photocurable resins, copolymers containing an acrylonitrile component, polyvinyl phenol, polyvinyl alcohol, novolak resins, cyanoethyl pullulan, etc. can also be used.

Besides, polymer materials having a high dielectric constant, such as pullulan, etc., can be used in addition to waxes, polyethylene, polychloroprene, polyethylene terephthalate, polyoxymethylene, polyvinyl chloride, polyvinylidene fluoride, polymethyl methacrylate, polysulfone, polycarbonate, polyimide cyanoethyl pullulan, poly(vinyl phenol) (PVP), poly(methyl methacrylate) (PMMA), polycarbonate (PC), polystyrene (PS), polyolefins, polyacrylamide, poly(acrylic acid), novolak resins, resol resins, polyimides, polyxylylene and epoxy resins.

With respect to the material of the insulator layer, organic compounds having water repellency are especially preferable. When the material has water repellency, an interaction between the insulator layer and the organic semiconductor layer is suppressed, and the crystallinity of the organic semiconductor layer is enhanced utilizing the cohesiveness which the organic semiconductor originally possesses, whereby the device performance can be enhanced. Examples thereof include polyparaxylylene derivatives described in Yasuda, et al., *Jpn. J. Appl. Phys.*, Vol. 42 (2003), pages 6614 to 6618; and those described in Janos Veres, et al., *Chem. Mater.*, Vol. 16 (2004), pages 4543 to 4555.

Figure 4:
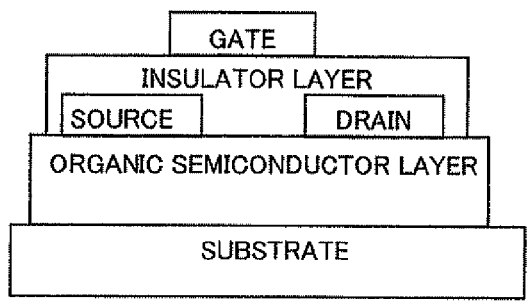
FIG. 4 is a view showing one embodiment of a device configuration of an organic thin film transistor of the present invention.

Also, when a top gate structure as shown in FIGS. 1 and 4 is used, by using such an organic compound as the material of the insulator layer, the fabrication can be carried out while minimizing the damage given to the organic semiconductor layer, and therefore, such is an effective method.

The foregoing insulator layer may be a mixed layer using the plural of the foregoing inorganic or organic compound materials or may be of a laminated structure thereof. In that case, the performance of the device can be controlled by mixing a material having a high dielectric constant and a material having water repellency or laminating the both as the need arises.

Also, the insulator layer may be an anodic oxide film or may include the anodic oxide film as a constituent. It is preferable that the anodic oxide film is subjected to a sealing treatment. The anodic oxide film is formed by anodically oxidizing an anodic oxidizable metal by a known method. Examples of the anodic oxidizable metal include aluminum and tantalum. The method of the anodic oxidation treatment is not particularly limited, and known methods can be employed. By carrying out the anodic oxidation treatment, an oxide film is formed. As an electrolytic solution which is used for the anodic oxidation treatment, any material can be used so far as it is able to form a porous oxide film. In general, sulfuric acid, phosphoric acid, oxalic acid, chromic acid, boric acid, sulfamic acid, benzenesulfonic acid, etc., or mixed acids composed of a combination of two or more kinds of those acids or salts thereof are useful. The treatment condition of the anodic oxidation variously varies depending upon the electrolytic solution to be used and cannot be unequivocally specified. However, in general, it is appropriate that the concentration of the electrolytic solution is in the range of from 1 to 80% by mass; that the temperature of the electrolytic solution is in the range of from 5 to 70° C.; that the current density is in the range of from 0.5 to 60 A/cm$^2$; that the voltage is in the range of from 1 to 100 volts; and that the electrolysis time is in the range of from 10 seconds to 5 minutes. A preferred anodic oxidation treatment is a method for carrying out the treatment with a direct current using, as the electrolytic solution, an aqueous solution of sulfuric acid, phosphoric acid or boric acid; however, an alternating current can also be applied. The concentration of such an acid is preferably from 5 to 45% by mass; and it is preferable that the electrolysis treatment is carried out at a temperature of the electrolytic solution of from 20 to 50° C. and a current density of from 0.5 to 20 A/cm$^2$ for from 20 to 250 seconds.

With respect to the thickness of the insulator layer, when the thickness of the layer is thin, an effective voltage which is applied to the organic semiconductor becomes large, and therefore, it is possible to lower a driving voltage and a threshold voltage of the device itself. However, on the contrary, a leak current between the source and the gate becomes large. Therefore, it is necessary to select an appropriate thickness of the film. The thickness of the film is usually from 10 nm to 5 µm, preferably from 50 nm to 2 µm, and more preferably from 100 nm to 1 µm.

Also, an arbitrary orientation treatment may be applied between the insulator layer and the organic semiconductor layer. A preferred embodiment thereof is a method in which a water repelling treatment or the like is applied onto the surface of the insulator layer, thereby reducing an interaction between the insulator layer and the organic semiconductor layer and enhancing the crystallinity of the organic semiconductor layer. Specifically, there is exemplified a method in which a silane coupling agent, for example, materials of self-assembled oriented film such as octadecyltrichlorosilane, trichloromethylsilazane, alkane phosphoric acids, alkane sulfonic acids, alkane carboxylic acids, etc., is brought into contact with the surface of an insulating film in a liquid phase or vapor phase state, thereby forming a self-assembled monolayer, which is then properly dried. Also, as used in the orientation of a liquid crystal, a method of disposing a film constituted of a polyimide or the like on the surface of an insulating film and subjecting the resulting surface to a rubbing treatment is also preferable.

Examples of the method for forming the insulator layer include dry processes such as a vacuum vapor deposition method, a molecular beam epitaxial growth method, an ion cluster beam method, a low energy ion beam method, an ion plating method, a CVD method, a sputtering method, an atmospheric pressure plasma method disclosed in JP-A-11-61406, JP-A-11-133205, JP-A-2000-121804, JP-A-2000-147209 and JP-A-2000-185362, etc.; and wet processes such as methods by coating, for example, a spray coating method, a spin coating method, a blade coating method, a dip coating method, a casting method, a roller coating method, a bar coating method, a die coating method, etc., and methods by patterning, for example, printing, inkjetting, etc. They can be applied depending upon the material. As the wet process, a method of coating and drying a solution prepared by dispersing a fine particle of an inorganic oxide in an arbitrary organic solvent or water and optionally, a dispersing agent such as surfactants, etc.; and a so-called sol-gel method of coating and drying a solution of an oxide precursor, for example, an alkoxide are useful.

Though the thickness of the organic semiconductor layer in the organic thin film transistor of the present invention is not particularly limited, it is usually from 0.5 nm to 1 µm, and preferably from 2 nm to 250 nm.

Also, a method for forming the organic semiconductor layer is not particularly limited, and a known method is employable. For example, the organic semiconductor layer is formed from the foregoing materials of the organic semiconductor layer by a molecular beam deposition method (MBE method), a vacuum vapor deposition method, chemical vapor deposition, a printing or coating method of a solution having a material dissolved in a solvent, such as a dipping method, a spin coating method, a casting method, a bar coating method, a roller coating method, etc., baking, electro-polymerization, molecular beam deposition, self-assembling from a solution, or a method of a combination of those methods.

When the crystallinity of the organic semiconductor layer is enhanced, the field effect mobility is enhanced. Therefore, in the case of employing fabrication (for example, vapor deposition, sputtering, etc.) from a vapor phase, it is desirable to keep the temperature of the substrate during the fabrication at a high temperature. The temperature is preferably from 50 to 250° C., and more preferably from 70 to 150° C. Also, regardless of the fabrication method, it is preferable that annealing is carried out after the fabrication because a high-performance device is obtained. With respect to the annealing, the temperature is preferably from 50 to 200° C., and more preferably from 70 to 200° C.; and the time is preferably from 10 minutes to 12 hours, and more preferably from 1 to 10 hours.

In the present invention, one kind of the materials selected among those represented by the general formula (a) may be used for the organic semiconductor layer. Also, a combination of the plurality of these materials or plural mixed thin films or laminates using a known semiconductor such as pentacene, a thiophene oligomer, etc. may be used.

A method for forming the organic thin film transistor of the present invention is not particularly limited but may be carried out in accordance with a known method. It is preferable that the formation is carried out in accordance with a desired device configuration through a series of device preparation steps including charging a substrate, forming a gate electrode, forming an insulator layer, forming an organic semiconductor layer, forming a source electrode and forming a drain electrode without utterly coming into contact with the air because the hindrance of a device performance to be caused due to the moisture or oxygen or the like in the air upon contact with the air can be prevented. When it is unable to evade the contact with the air once, it is preferable that steps after the fabrication of the organic semiconductor layer are a step of not contacting with the air at all; and that immediately before the fabrication of the organic semiconductor layer, the surface on which the organic semiconductor layer is laminated (for example, in the case of the device B, the surface of the insulating layer on which are partially laminated the source electrode and the drain electrode) is cleaned and activated by means of irradiation with ultraviolet rays, irradiation with ultraviolet rays/ozone, oxygen plasma, argon plasma, etc., and the organic semiconductor layer is then laminated.

Furthermore, for example, taking into consideration influences of oxygen, water, etc. contained in the air against the organic semiconductor layer, a gas barrier layer may be formed entirely or partially on the peripheral surface of the organic transistor device. As a material for forming the gas barrier layer, those which are commonly used in this field can be used, and examples thereof include polyvinyl alcohol, an ethylene-vinyl alcohol copolymer, polyvinyl chloride, polyvinylidene chloride, polychlorotrifluoroethylene, etc. Furthermore, the inorganic materials having insulating properties, which are exemplified in the foregoing insulator layer, can be used.

The organic thin film transistor in the present invention can also be used as a light emitting device using charges injected from the source and drain electrodes. That is, the organic thin film transistor can be used as an organic thin film light emitting transistor also having a function as a light emitting device (organic EL device). This is able to control the emission intensity by controlling a current flowing between the source and drain electrodes by the gate electrode. Since the transistor for controlling the emission and the light emitting device can be consolidated, the costs can be reduced due to an enhancement of the degree of opening of a display or simplification of the preparation process, resulting in great advantages from the standpoint of practical use. When used as an organic light emitting transistor, the contents which have been described previously in detail are sufficient. However, in order to make the organic thin film transistor of the present invention operate as an organic light emitting transistor, it is necessary to inject holes from one of a source and a drain and to inject electrons from the other; and in order to enhance the emission performance, it is preferable that the following condition is met.

(Source and Drain)

With respect to the organic thin film light emitting transistor of the present invention, in order to enhance the injection properties of holes, it is preferable that at least one of the electrodes is a hole injection electrode. The hole injection electrode as referred to herein is an electrode including a material having the foregoing work function of 4.2 eV or more.

Also, in order to enhance the injection properties of electrons, it is preferable that at least one of the electrodes is an electron injection electrode. The electron injection electrode as referred to herein is an electrode including a material having the foregoing work function of not more than 4.3 eV. An organic thin film light emitting transistor provided with electrodes such that one of the electrodes has hole injection properties, with the other having electron injection properties, is more preferable.

(Device Configuration)

With respect to the organic thin film light emitting transistor of the present invention, for the purpose of enhancing the hole injection properties, it is preferable that a hole injection layer is inserted between at least one of the electrodes and the organic semiconductor layer. With respect to the hole injection layer, amine based materials which are used as a hole injection material or a hole transport material in organic EL devices and so on are useful.

Also, for the purpose of enhancing the electron injection properties, it is preferable that an electron injection layer is inserted between at least one of the electrodes and the organic semiconductor layer. Similar to the hole injection layer, electron injection materials which are used in organic EL devices and so on are useful.

An organic thin film light emitting transistor in which a hole injection layer is provided beneath at least one of the electrodes, and an electron injection layer is provided beneath the other electrode is more preferable.

Also, in the organic thin film light emitting transistor of the present embodiment, for example, for the purpose of enhancing injection efficiency, a buffer layer may be provided between the semiconductor layer and each of the source electrode and the drain electrode.

EXAMPLES

Next, the present invention is described in more detail with reference to the following Examples.

Synthesis Example 1

Synthesis of Compound (A-1)

The foregoing Compound (A-1) was synthesized in the following manner. A synthesis route is described below.

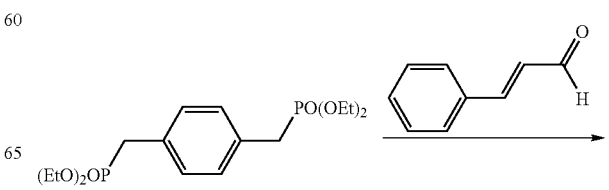

-continued

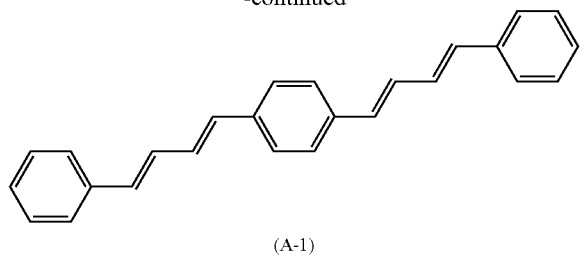

(A-1)

3.36 g (30 mmoles) of t-butoxypotassium is added in a tetrahydrofuran solution (100 mL) of 2.64 g (20 mmoles) of cinnamyl aldehyde and 3.78 g (10 mmoles) of a phosphorous ester compound, and the mixture is stirred at room temperature in an argon atmosphere. After completion of the reaction, water and methanol are added, followed by filtration. Furthermore, the resulting reaction mixture was recrystallized from toluene to obtain 2.01 g (yield: 60%) of Compound (A-1). The present compound was confirmed to be a desired compound by the measurement of FD-MS (field desorption mass analysis). The apparatus used for the measurement, measurement condition and obtained results are shown below.
Apparatus:
  HX110 (manufactured by JEOL Ltd.)
Condition:
  Accelerating voltage: 8 kV
  Scan range: m/z=50 to 1,500
Results:
  FD-MS, calculated for $C_{26}H_{22}$=334, found, m/z=334 ($M^+$, 100)

Example 1

Manufacture of Organic Thin Film Transistor

An organic thin film transistor was prepared according to the following procedures. First of all, a glass substrate was ultrasonically cleaned with a neutral detergent, pure water, acetone and ethanol each for 30 minutes, and gold (Au) was then fabricated in a thickness of 40 nm thereon by a sputtering method, thereby preparing a gate electrode. Subsequently, this substrate was set in a fabrication zone of a thermal CVD apparatus. On the other hand, 250 mg of a polyparaxylene derivative [polyparaxylene chloride (Parylene)] (a trade name: diX-C, manufactured by Daisan Kasei Co., Ltd.) as a raw material of the insulator layer is charged in a Petri dish and placed in an evaporation zone of the raw material. The thermal CVD apparatus was evacuated by a vacuum pump; and after the pressure reached 5 Pa, the evaporation zone and the polymerization zone were heated up to 180° C. and 680° C., respectively and allowed to stand for 2 hours, thereby forming an insulator layer having a thickness of 1 μm on the gate electrode.

Figure 7:
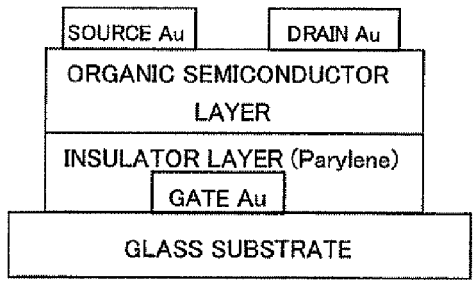
FIG. 7 is a view showing one embodiment of a device configuration of an organic thin film transistor in the Examples of the present invention.

Next, the substrate was placed in a vacuum vapor deposition apparatus (EX-400, manufactured by ULVAC, Inc.), and the foregoing Compound (A-2) was fabricated in a thickness of 50 nm as an organic semiconductor layer on the insulator layer at a vapor deposition rate of 0.05 nm/s. Subsequently, gold was fabricated in a thickness of 50 nm through a metal mask, thereby forming a source electrode and a drain electrode which did not come into contact with each other at a space (channel length L) of 75 μm. At that time, the fabrication was carried out such that a width (channel width W) between the source electrode and the drain electrode was 5 mm, thereby preparing an organic thin film transistor (see FIG. 7).

The obtained organic thin film transistor was evaluated at room temperature by using KEITHLEY's 4200-SCS in the following manner. A gate voltage of −40 V was applied to the gate electrode of the organic thin film transistor, and a voltage was applied between the source and the drain, thereby flowing a current. In that case, a hole is induced in a channel region (between the source and the drain) of the organic semiconductor layer, whereby the organic thin film transistor works as a p-type transistor. An ON/OFF ratio of the current between the source and drain electrodes in a current saturation region was $1\times10^6$. Also, an electric field effect mobility μ of the hole was calculated in accordance with the following expression (A) and found to be $2\times10^{-1}$ cm$^2$/Vs.

$$I_D=(W/2L)\cdot C\mu\cdot(V_G-V_T)^2 \quad (A)$$

In the expression, $I_D$ represents a current between the source and the drain; W represents a channel width; L represents a channel length; C represents an electric capacitance per unit area of the gate insulator layer; $V_T$ represents a gate threshold voltage; and $V_G$ represents a gate voltage.

Example 2

Manufacture of Organic Thin Film Transistor

An organic semiconductor layer was fabricated in the same manner as in Example 1, except for using Compound (A-11) as the material of the organic semiconductor layer in place of the Compound (A-2). Subsequently, Ca was vacuum vapor deposited in a thickness of 20 nm as the source and drain electrodes through the metal mask in place of Au at a vapor deposition rate of 0.05 nm/s. Thereafter, Ag was vapor deposited in a thickness of 50 nm at a vapor deposition rate of 0.05 nm/s, thereby coating Ca. There was thus prepared an organic thin film transistor. With respect to the obtained organic thin film transistors, an ON/OFF ratio of the current between the source and drain electrodes was measured in the same manner as in Example 1, except for subjecting it to n-type driving at a gate voltage $V_G$ of +40 V, and a field effect mobility μ of the electron was calculated. The results are shown in Table 1.

Examples 3 to 8

Manufacture of Organic Thin Film Transistor

Organic thin film transistors were prepared in the same manner as in Example 1, except for using each of the compounds shown in Table 1 as the material of the organic semiconductor layer in place of the Compound (A-2). The obtained organic thin film transistors were each subjected to p-type driving at a gate voltage $V_G$ of −40 V in the same manner as in Example 1. Also, an ON/OFF ratio of the current between the source and drain electrodes was measured in the same manner as in Example 1, and a field effect mobility μ of the hole was calculated. The results are shown in Table 1.

Comparative Example 1

Manufacture of Organic Thin Film Transistor

Cleaning of a substrate, fabrication of a gate electrode and preparation of an insulator layer were carried out in the same manner as in Example 1. Subsequently, 3% by mass of poly-paraphenylene vinylene (PPV) [molecular weight (Mn):

86,000, molecular weight distribution (Mw/Mn) 5.1] was dissolved in toluene, and the solution was fabricated on the substrate which had been fabricated up to the foregoing insulator layer by a spin coating method and dried at 120° C. in a nitrogen atmosphere, thereby fabricating it as an organic semiconductor layer. Subsequently, gold (Au) was fabricated in a thickness of 50 nm through a metal mask by the vacuum vapor deposition apparatus, thereby forming the source and drain electrodes which did not come into contact with each other. There was thus prepared an organic thin film transistor.

The obtained organic thin film transistor was subjected to p-type driving at a gate voltage $V_G$ of −40 V in the same manner as in Example 1. Also, an ON/OFF ratio of the current between the source and drain electrodes was measured, and a field effect mobility μ of the hole was calculated. The results are shown in Table 1.

Comparative Example 2

Manufacture of Organic Thin Film Transistor

Fabrication up to the organic semiconductor layer was carried out in exactly the same manner as in Comparative Example 1 using polyparaphenylene vinylene (PPV) as the material of the organic semiconductor layer. Subsequently, Ca was vacuum vapor deposited in a thickness of 20 nm as the source and drain electrodes through a metal mask in place of Au at a vapor deposition rate of 0.05 nm/s. Thereafter, Ag was vapor deposited in a thickness of 50 nm at a vapor deposition rate of 0.05 nm/s, thereby coating Ca. There was thus prepared an organic thin film transistor.

The obtained organic thin film transistor was subjected to n-type driving at a gate voltage $V_G$ of +40 V in the same manner as in Example 1. An ON/OFF ratio of the current between the source and drain electrodes was measured, and a field effect mobility μ of the electron was calculated. The results are shown in Table 1.

TABLE 1

| | Kind of compound of organic semi-conductor layer | Kind of transistor | Field effect mobility (cm²/Vs) | ON/OFF ratio |
|---|---|---|---|---|
| Example 1 | (A-2) | p-Type | $2 \times 10^{-1}$ | $1 \times 10^6$ |
| Example 2 | (A-11) | n-Type | $3 \times 10^{-2}$ | $1 \times 10^5$ |
| Example 3 | (A-21) | p-Type | $3 \times 10^{-1}$ | $2 \times 10^6$ |
| Example 4 | (A-22) | p-Type | $4 \times 10^{-1}$ | $3 \times 10^6$ |
| Example 5 | (A-23) | p-Type | $2 \times 10^{-1}$ | $1 \times 10^6$ |
| Example 6 | (A-25) | p-Type | $3 \times 10^{-1}$ | $3 \times 10^6$ |
| Example 7 | (B-7) | p-Type | $2 \times 10^{-1}$ | $5 \times 10^5$ |
| Example 8 | (B-10) | p-Type | $3 \times 10^{-1}$ | $2 \times 10^6$ |
| Comparative Example 1 | PPV | p-Type | $1 \times 10^{-5}$ | $1 \times 10^3$ |
| Comparative Example 2 | PPV | n-Type | $1 \times 10^{-4}$ | $1 \times 10^3$ |

Example 9

Manufacture of Organic Thin Film Light Emitting Transistor

An organic thin film light emitting transistor was prepared according to the following procedures. First of all, the surface of an Si substrate (p-type also serving as a gate electrode, specific resistivity: 1 Ωcm) was oxidized by a thermal oxidation method to prepare a 300 nm-thick thermally oxidized film on the substrate, which was then used as an insulator layer. Furthermore, after completely removing the SiO₂ film fabricated on one surface of the substrate by means of dry etching, chromium was fabricated in a thickness of 20 nm thereon by a sputtering method; and gold (Au) was further fabricated in a thickness of 100 nm thereon by means of sputtering, thereby forming a lead-out electrode. This substrate was ultrasonically cleaned with a neutral detergent, pure water, acetone and ethanol each for 30 minutes.

Figure 9:
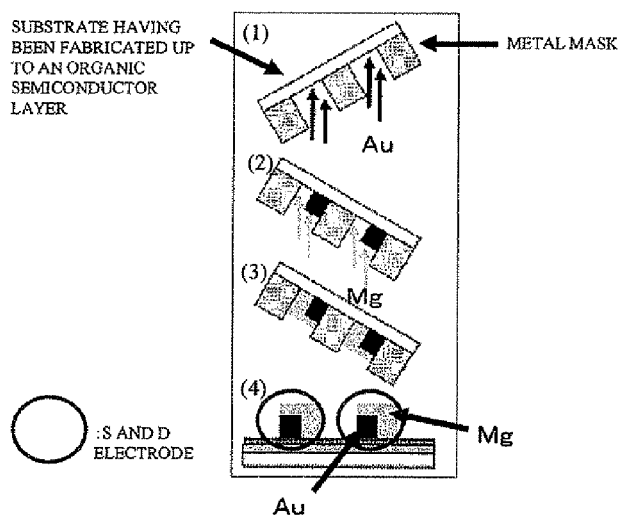
FIG. 9 is a view showing one embodiment of a device configuration of an organic thin film light emitting transistor in the Examples of the present invention.

Next, the foregoing substrate was placed in a vacuum vapor deposition apparatus (EX-900, manufactured by ULVAC, Inc.), and the foregoing Compound (A-2) was fabricated in a thickness of 100 nm as an organic semiconductor light emitting layer on the insulator layer (SiO₂) at a vapor deposition rate of 0.05 nm/s. Subsequently, a metal mask having a channel length of 75 μm and a channel width 5 mm was placed in the same manner as described previously, and gold was fabricated in a thickness of 50 nm through the mask in a state of inclining the substrate at 45° against an evaporation source. Subsequently, Mg was vapor deposited in a thickness of 100 nm in a state of inclining the substrate at 45° in the reverse direction, thereby preparing an organic thin film light emitting transistor in which a source electrode and a drain electrode which did not come into contact with each other were each substantially provided with a hole injection electrode (Au) and an electron injection electrode (Mg) (see FIG. 9).

When −100 V was applied between the source and drain electrodes, and −100 V was applied to the gate electrode, blue emission was obtained.

Example 10

Manufacture of Organic Thin Film Transistor

An organic semiconductor layer was fabricated in the same manner as in Example 1. Subsequently, prior to vapor depositing Au as a source drain electrode through a metal mask, a buffer layer MoO₃ was vacuum vapor deposited in a thickness of 10 nm at a vapor deposition rate of 0.05 nm/s, and subsequently, Au was vapor deposited. The obtained organic thin film transistor was subjected to p-type driving at a gate voltage $V_G$ of −40 V in the same manner as in Example 1. An ON/OFF ratio of the current between the source and drain electrodes was measured, and a field effect mobility μ of the hole was calculated. As a result, the field effect mobility was found to be $3 \times 10^{-1}$ cm²/Vs, and the ON/OFF ratio was found to be $1 \times 10^6$.

Industrial Applicability

As described above in detail, by using a compound having a specified structure with high electron mobility as a material of an organic semiconductor layer, the organic thin film transistor of the present invention has a fast response speed (driving speed), has a large ON/OFF ratio and is high in performance as a transistor; and it is also able to be utilized as an organic thin film light emitting transistor which can achieve light emission.

The invention claimed is:

1. An organic thin film transistor comprising a substrate having thereon at least three terminals of a gate electrode, a source electrode and a drain electrode, an insulator layer and an organic semiconductor layer, with a current between a source and a drain being controlled upon application of a voltage to the gate electrode, wherein the organic semiconductor layer includes an organic compound having a structure of the following general formula (a):

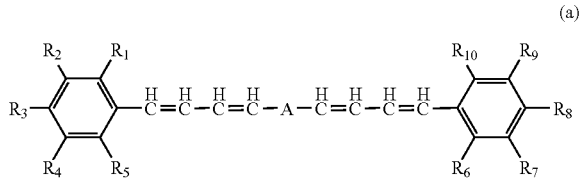

(a)

wherein A represents a divalent aromatic hydrocarbon group having from 6 to 60 carbon atoms or a divalent aromatic heterocyclic group having from 1 to 60 carbon atoms; and $R_1$ to $R_{10}$ each independently represents a hydrogen atom, a halogen atom, a cyano group, an alkyl group having from 1 to 30 carbon atoms, a haloalkyl group having from 1 to 30 carbon atoms, an alkoxyl group having from 1 to 30 carbon atoms, a haloalkoxyl group having from 1 to 30 carbon atoms, an alkylthio group having from 1 to 30 carbon atoms, a haloalkylthio group having from 1 to 30 carbon atoms, an alkylamino group having from 1 to 30 carbon atoms, a dialkylamino group having from 2 to 60 carbon atoms, wherein the alkyl groups of said dialkylamino group are optionally bonded to each other to form a nitrogen atom-containing cyclic structure, an alkylsulfonyl group having from 1 to 30 carbon atoms, a haloalkylsulfonyl group having from 1 to 30 carbon atoms, an aromatic hydrocarbon group having from 6 to 60 carbon atoms or an aromatic heterocyclic group having from 1 to 60 carbon atoms; each of these groups being optionally substituted; and each of these groups being optionally connected to each other to form an aromatic hydrocarbon group having from 6 to 60 carbon atoms or an aromatic heterocyclic group having from 1 to 60 carbon atoms.

2. The organic thin film transistor according to claim 1, wherein in formula (a), A is a group containing a benzene ring.

3. The organic thin film transistor according to claim 1, wherein in formula (a), A is an aromatic heterocyclic group containing a nitrogen atom.

4. The organic thin film transistor according to claim 1, wherein in formula (a), A is a divalent residue of chrysene.

5. The organic thin film transistor according to claim 1, wherein in formula (a), A is an aromatic heterocyclic group containing a 5-membered ring aromatic heterocyclic ring and a benzene ring.

6. The organic thin film transistor according to claim 4, wherein in formula (a), A is an aromatic heterocyclic group containing a 5-membered ring aromatic heterocyclic ring and a benzene ring.

7. The organic thin film transistor according to claim 5, wherein the 5-membered ring aromatic heterocyclic ring has one or more oxygen atoms or sulfur atoms, and an olefin group is connected to the benzene ring.

8. The organic thin film transistor according to claim 1, wherein in formula (a), the two butadienylene groups are substituted at a symmetric position relative to A.

9. The organic thin film transistor according to claim 1, wherein in formula (a), $R_1$, $R_5$, $R_6$ and $R_{10}$ are each independently a hydrogen atom or a fluorine atom.

10. The organic thin film transistor according to claim 1, wherein in formula (a), $R_1$ to $R_{10}$ are each independently a hydrogen atom or an alkyl group having from 1 to 30 carbon atom.

11. The organic thin film transistor according to claim 1, wherein in formula (a), $R_1$ to $R_{10}$ are each independently a hydrogen atom, a halogen atom, a cyano group or a haloalkyl group having from 1 to 30 carbon atoms.

12. The organic thin film transistor according to claim 1, comprising a buffer layer between each of the source and drain electrodes and the organic semiconductor layer.

13. An organic thin film light emitting transistor, wherein in the organic thin film transistor according to claim 1, light emission is obtained utilizing a current flowing between the source and the drain, and the light emission is controlled upon application of a voltage to the gate electrode.

14. The organic thin film light emitting transistor according to claim 13, wherein at least one of the source and the drain is composed of a material having a work function of 4.2 eV or more, and/or at least one of them is composed of a material having a work function of not more than 4.3 eV.

15. The organic thin film light emitting transistor according to claim 13, comprising a buffer layer between each of the source and drain electrode and the organic semiconductor layer.

* * * * *